United States Patent
Ishii

(10) Patent No.: US 7,682,856 B2
(45) Date of Patent: Mar. 23, 2010

(54) ELECTRO-OPTICAL DEVICE, METHOD OF MANUFACTURING ELECTRO-OPTICAL DEVICE, AND ELECTRONIC APPARATUS

(75) Inventor: Tatsuya Ishii, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 341 days.

(21) Appl. No.: 11/522,792

(22) Filed: Sep. 18, 2006

(65) Prior Publication Data

US 2007/0117239 A1    May 24, 2007

(30) Foreign Application Priority Data

Nov. 22, 2005   (JP) ............................. 2005-337003

(51) Int. Cl.
*H01L 21/00* (2006.01)
(52) U.S. Cl. .................. 438/30; 438/154; 438/164; 257/E21.32; 257/E27.111
(58) Field of Classification Search ............... 438/30, 438/154–164; 257/66–88, E21.32, E21.413, 257/E27.111
See application file for complete search history.

(56) References Cited

U.S. PATENT DOCUMENTS

| | | |
|---|---|---|
| 2002/0142554 A1 | 10/2002 | Nakajima |
| 2002/0167025 A1* | 11/2002 | Nagao et al. ................ 257/200 |
| 2003/0025127 A1* | 2/2003 | Yanai et al. ................. 257/158 |
| 2005/0199878 A1* | 9/2005 | Arao et al. .................... 257/66 |
| 2005/0242377 A1* | 11/2005 | Eguchi et al. ............... 257/240 |
| 2007/0181890 A1* | 8/2007 | Yamazaki et al. ............ 257/79 |

FOREIGN PATENT DOCUMENTS

| | | |
|---|---|---|
| JP | 10-233511 A | 9/1998 |
| JP | A-2002-368125 | 12/2002 |

\* cited by examiner

*Primary Examiner*—Alexander G Ghyka
*Assistant Examiner*—Abdulfattah Mustapha
(74) *Attorney, Agent, or Firm*—AdvantEdge Law Group, LLC

(57) ABSTRACT

An electro-optical device includes, above a substrate, a plurality of data lines and a plurality of scanning lines that cross each other, a plurality of pixel electrodes that are provided so as to correspond to intersections between the plurality of data lines and the plurality of scanning lines, and transistors, each of which is electrically connected to the pixel electrode and has an LDD structure. Further, each of the transistors has a semiconductor layer in which an impurity region is formed around a channel region, the impurity region having a heavily doped region and a lightly doped region whose impurity concentrations are different from each other, a first gate electrode that is formed on the channel region so as not to overlap the lightly doped region in plan view, and a second gate electrode that is electrically connected to the first gate electrode and that is formed on the first gate electrode so as to cover the lightly doped region in plan view.

7 Claims, 17 Drawing Sheets

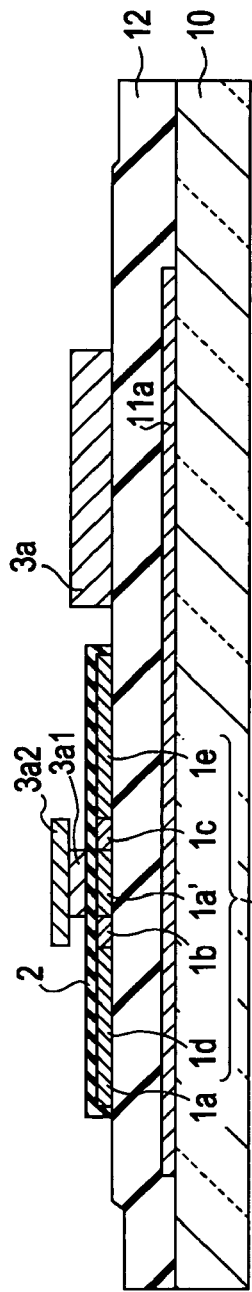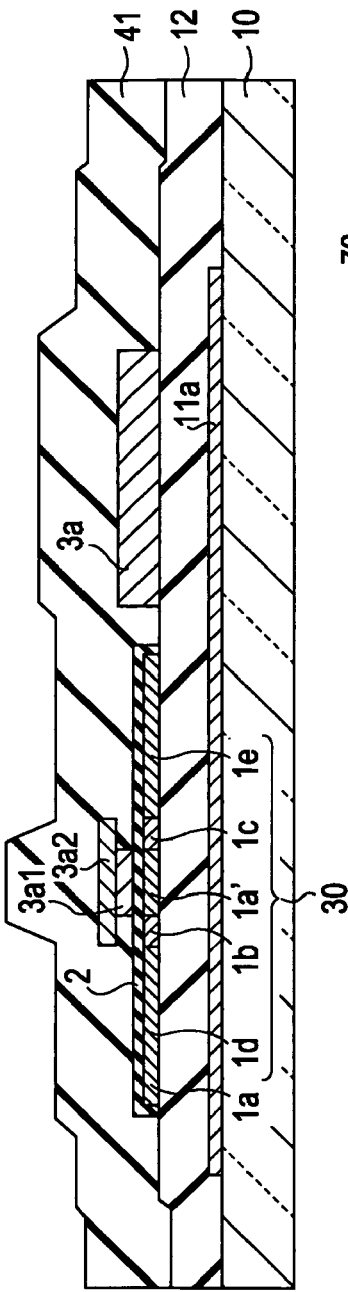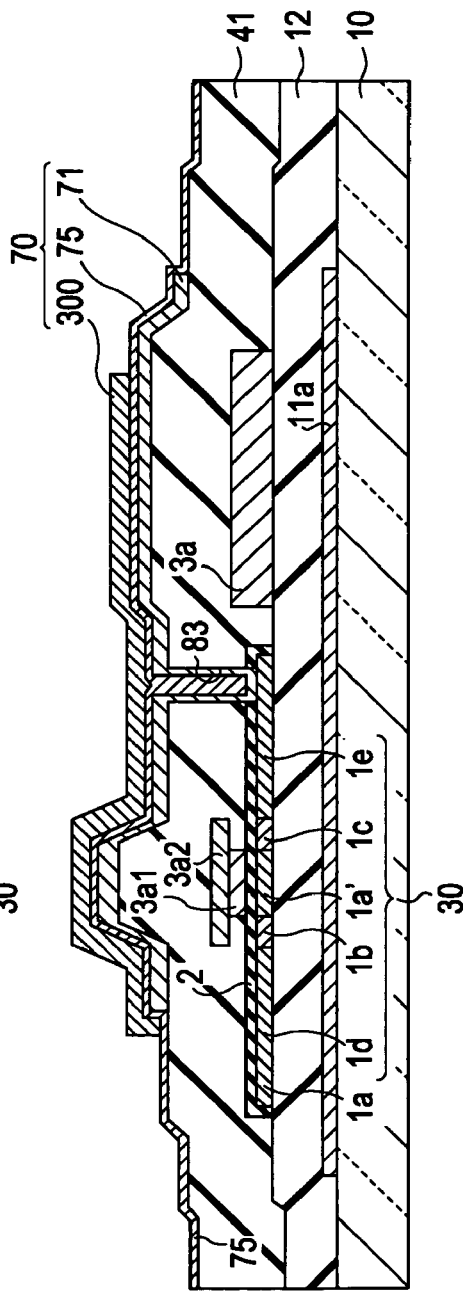

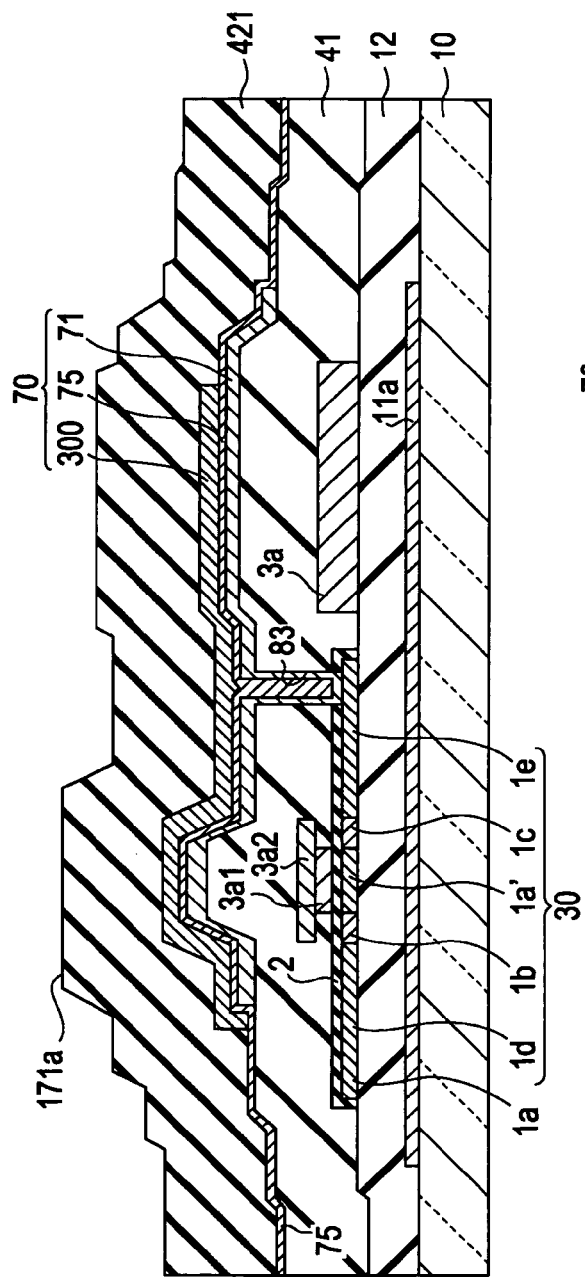
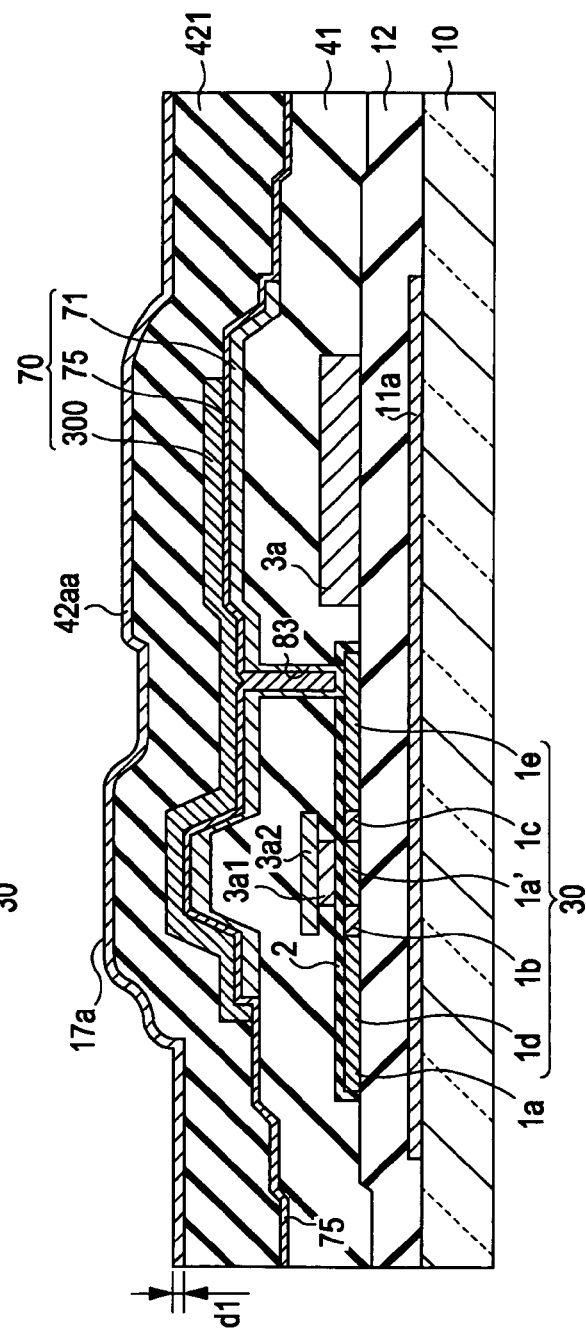
FIG. 9A
FIG. 9B

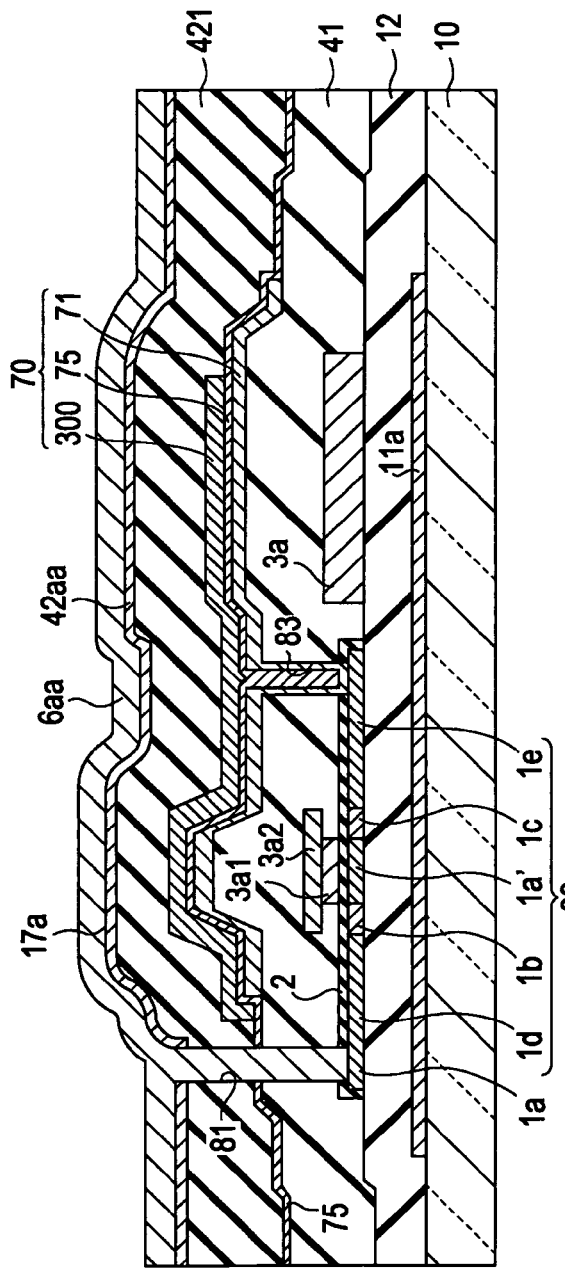
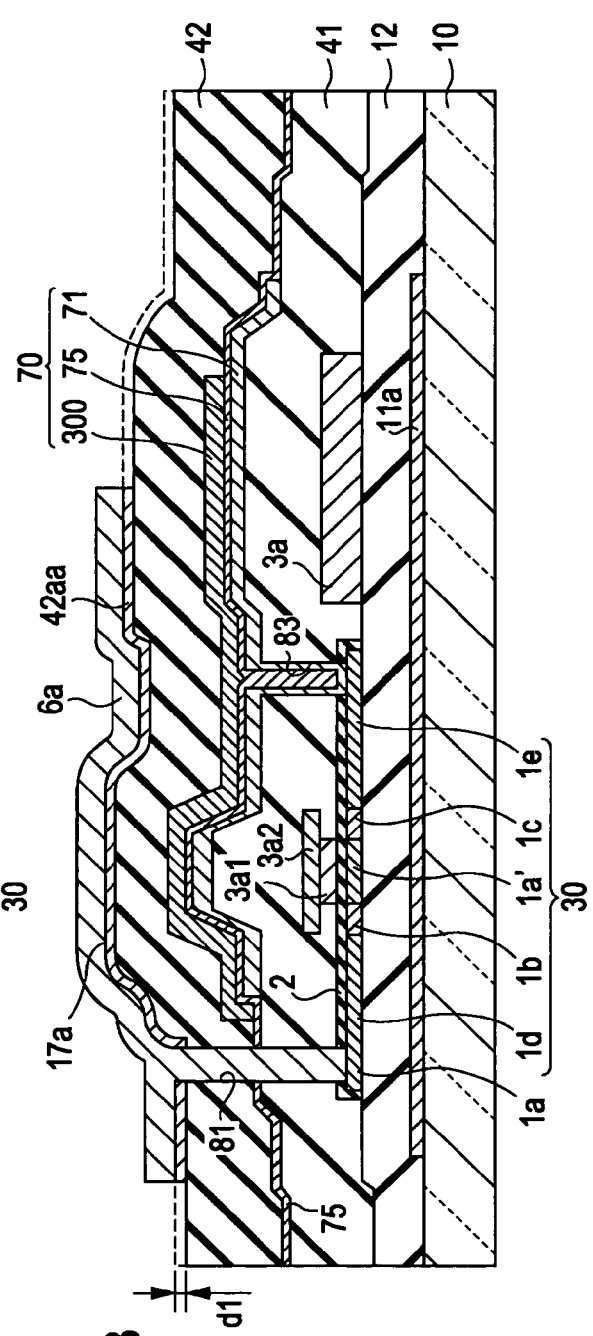
FIG. 10A
FIG. 10B

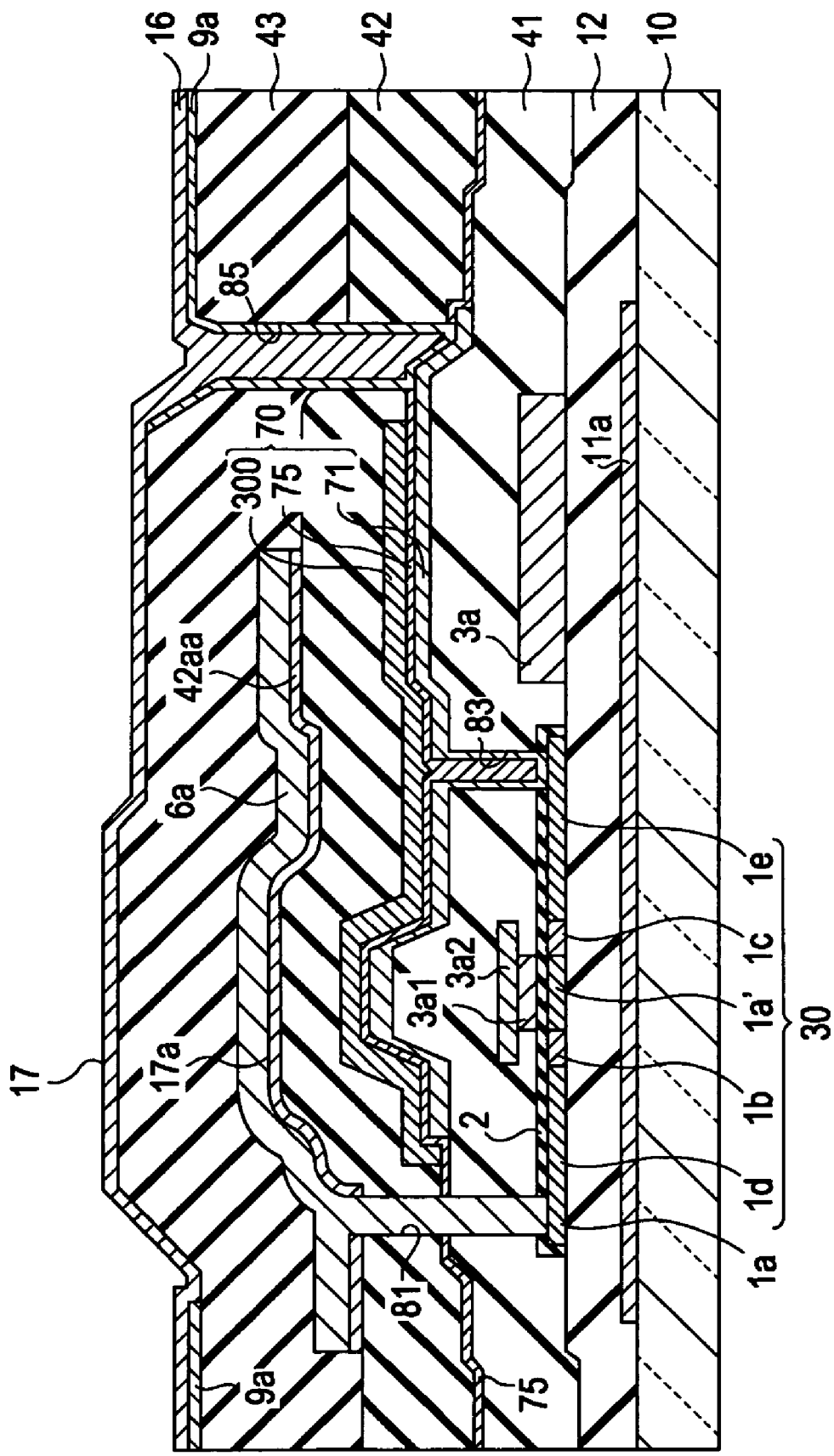

ELECTRO-OPTICAL DEVICE, METHOD OF MANUFACTURING ELECTRO-OPTICAL DEVICE, AND ELECTRONIC APPARATUS

BACKGROUND

1. Technical Field

The present invention relates to an electro-optical device, such as a liquid crystal device in which a driving transistor having a lightly-doped drain (LDD) structure is provided in a pixel portion, to a method of manufacturing an electro-optical device, and to an electronic apparatus including an electro-optical device.

2. Related Art

In general, in electro-optical devices, in order that an on current is suppressed from being decreased at the time of performing inversion control of liquid crystal in pixel portions and an off current is decreased, a thin-film transistor having an LDD structure is formed in each of the pixel portions. According to this LDD structure, a gate electrode is used as a mask, and regions whose impurity concentrations are different from each other are formed in a semiconductor layer.

Further, JP-A-2002-368125 discloses a semiconductor device, such as a static random access memory (SRAM), including gate electrodes having a plurality of layers having the same width.

In a liquid crystal device that is an example of an electro-optical device, light that is emitted from a light source, such as a backlight and the like, is irradiated onto a pixel region that forms an image display region. This light has high directivity and strong intensity. Accordingly, when the light is irradiated onto a semiconductor included in a transistor having an LDD, a light leakage current may be generated, and thus an image display defect, such as a flicker, may easily occur. In a lightly doped region of the semiconductor layer where impurities are doped with a relatively lower density than the other regions, a light leakage current may be easily generated, and it is difficult for the lightly doped region to be sufficiently shielded from the light by only a light-shielding unit, such as a light-shielding film or the like.

In this case, a method of shielding light by a gate electrode is also considered. However, due to the restriction of manufacturing processes when the LDD structure is manufactured and the restriction of an electrode structure of a gate electrode, it is difficult for the lightly doped region to be sufficiently shielded from the light. For example, when an electrode structure of a gate electrode disclosed in JP-A-2002-368125 is applied to the transistor having the LDD structure, since a plurality of layers forming the gate electrode have the same width, it is not possible to shield from light the lightly doped region not overlapping the gate electrode in plan view, from the design viewpoint of the LDD structure and the manufacturing processes.

SUMMARY

An advantage of some aspects of the invention is that it provides an electro-optical device, in which a light leakage current can be reduced, and a high-resolution image can be displayed by making use of electrical characteristic of a transistor having an LDD structure, a method of manufacturing an electro-optical device, and an electronic apparatus having an electro-optical device.

According to a first aspect of the invention, an electro-optical device includes, above a substrate, a plurality of data lines and a plurality of scanning lines that cross each other, a plurality of pixel electrodes that are provided so as to correspond to intersections between the plurality of data lines and the plurality of scanning lines, and transistors, each of which is electrically connected to the pixel electrode and has an LDD structure. Further, each of the transistors has a semiconductor layer in which an impurity region is formed around a channel region, the impurity region having a heavily doped region and a lightly doped region whose impurity concentrations are different from each other, a first gate electrode that is formed on the channel region so as not to overlap the lightly doped region in plan view, and a second gate electrode that is electrically connected to the first gate electrode and that is formed on the first gate electrode so as to cover the lightly doped region in plan view.

In the electro-optical device according to the first aspect of the invention, the plurality of pixel electrodes are provided so as to correspond to intersections between the plurality of data lines and the plurality of scanning lines. For example, the plurality of pixel electrodes are provided in a matrix in a pixel region that is an image display region. The transistor having the LDD structure serves as a driving transistor for driving liquid crystal, and it is formed in every pixel portion that has a pixel electrode. The transistor is turned on or off according to the scanning signal supplied through the scanning line, and provides a signal path for supplying an image signal to the pixel electrode.

In the electro-optical device according to the first aspect of the invention, a semiconductor layer included in each of the transistors has an LDD structure in which a heavily doped region and a lightly doped region whose impurity concentrations are different from each other are formed in a manner of mirror symmetry at both sides of the channel region. When the transistor does not operate, an off current flowing through the lightly doped region is reduced, and an on current flowing when the transistor operates is suppressed from being reduced.

The first gate electrode is formed on the channel region such that it does not overlap the lightly doped region in plan view. Specifically, the first gate electrode is formed on the channel region of the semiconductor layer with a dielectric layer formed on the semiconductor layer therebetween. In this case, since the first gate electrode is formed so as not to overlap the lightly doped region, offset between the heavily doped region and the first gate electrode is sufficiently ensured.

The second gate electrode is formed on the first gate electrode so as to cover the lightly doped region in plan view. Accordingly, the gate electrode of the transistor has a multi-layered structure having the first gate electrode and the second gate electrode. For example, in the gate electrode of the transistor, the second gate electrode made of metal silicide is formed in the first gate electrode made of, for example, a polysilicon film. The second gate electrode can perform light shielding such that light irradiated from a light source of the electro-optical device, such as, for example, the liquid crystal device, is not irradiated onto the lightly doped region, and can reduce a light leakage current flowing through the lightly doped region. In addition, since the second gate electrode is formed on the semiconductor layer with the first gate electrode interposed therebetween, it is possible to effectively shield from the light the lightly doped region at a closer location to the lightly doped region.

Accordingly, in the electro-optical device according to the first aspect of the invention, by making use of electrical characteristic of the transistor having the LDD structure in which the light leakage current is reduced, it is possible to reduce disadvantages, such as a flicker, occurring when image display is performed, thereby achieving high-resolution image display.

Preferably, in a longitudinal direction of a channel of the transistor, a terminating end of the first gate electrode aligns with an interface between the lightly doped region and the channel region in plan view.

According to this aspect, since the first gate electrode and the lightly doped region do not overlap each other, it is possible to reduce a parasitic capacitance generated between the lightly doped region and the first gate electrode. Therefore, the display performance of the electro-optical device can be improved, and the high-speed operation of the transistor can be performed.

Preferably, in a longitudinal direction of a channel of the transistor, a terminating end of the second gate electrode aligns with an interface between the lightly doped region and the heavily doped region in plan view.

According to this aspect, since the second gate electrode and the heavily doped region do not overlap each other, it is possible to reduce a parasitic capacitance generated between the heavily doped region and the second gate electrode. Therefore, the display performance of the electro-optical device can be improved, and the high-speed operation of the transistor can be performed.

Preferably, the second gate electrode extends over a region where the first gate electrode is exposed to an opening of an insulating film formed on the first gate electrode and the lightly doped region.

According to this aspect, it is possible to form the gate electrode, in which the first gate electrode and the second gate electrode are electrically connected to each other through the opening formed in the insulating film.

After forming the second gate electrode so as to extend over a region where the first gate electrode is exposed to an opening of an insulating film and the lightly doped region, the second gate electrode can be formed by removing the portion overlapping the heavily doped region in plan view by means of etching.

Preferably, the second gate electrode is electrically connected to the first gate electrode on the channel region.

According to this aspect, the second gate electrode is formed in the opening formed by removing the portion of the insulating film overlapping the channel region by means of wet etching, and the first gate electrode and the second gate electrode exposed to the opening can be electrically connected to each other.

Preferably, the second gate electrode is electrically connected to a portion of the first gate electrode that extends to an outside region of the channel region.

According to this aspect, it is possible to suppress the first gate electrode from being excessively removed by an etching process used when the opening through which the first gate electrode and the second gate electrode are electrically connected to each other is formed in the insulating film. Therefore, the first gate electrode and the second gate electrode can be reliably electrically connected to each other.

Preferably, the electro-optical device according the first aspect of the invention further includes light-shielding films, each of which is formed so as to cover the transistor on the second gate electrode.

According to this aspect, the light shielding can be effectively made by the light-shielding film formed so as to cover the transistor on the second gate electrode in addition to the second gate electrode formed at a location closer to the lightly doped region, as compared with a case in which the light shielding is made by only the second gate electrode.

According to a second aspect of the invention, a method of manufacturing an electro-optical device includes, above a substrate, forming a plurality of data lines and a plurality of scanning lines that cross each other, forming resist films in predetermined regions of semiconductor layers that are formed above the substrate, doping impurities into the semiconductor layers using the resist films as masks so as to form impurity regions around the predetermined regions, forming conductive films to be first gate electrodes and second gate electrodes so as to cover the predetermined regions and regions of the impurity regions adjacent to the predetermined regions in a longitudinal direction of a channel of the transistor, after the resist films are removed, doping the impurities into outside regions of the regions of the impurity regions adjacent to the predetermined regions while using the second gate electrodes as masks so as to form heavily doped regions and lightly doped regions whose impurity concentrations are different from each other in the semiconductor layers, selectively removing the conductive films from the sides of the conductive films so as to form first gate electrodes that do not overlap the lightly doped regions, and forming pixel electrodes so as to correspond to intersections between the plurality of data lines and the plurality of scanning lines.

In the method of manufacturing the electro-optical device according to the second aspect of the invention, by doping the impurities in the semiconductor layer, an impurity region can be formed in the regions of the semiconductor layer adjacent to the predetermined region. In this case, the 'predetermined region' refers to a region of the semiconductor layer that finally becomes the channel region of the transistor.

During the forming of the conductive film and the second gate electrode, the conductive film to be the first gate electrode and the second gate electrode are sequentially formed. The conductive film and the second gate electrode are formed to be the same size so as to cover the predetermined regions and regions of the impurity regions adjacent to the predetermined regions in a longitudinal direction of a channel of the transistor. In this case, the 'adjacent region' refers to a region of the semiconductor layer that becomes the lightly doped region by the doping of the impurities in the outside region.

During the doping of the impurities in the outside region, the impurities are doped in the outside region of the region of the impurity region that finally becomes a lightly doped region, that is, the region of the semiconductor layer that finally becomes the heavily doped region. At this time, the second gate electrode serves as a mask such that the impurities are not further doped in the adjacent region.

During the forming of the first gate electrode, the conductive film is selectively removed from the side of the conductive film by means of dry etching, such as an isotropic plasma treatment and the like, and the first gate electrode is formed such that it does not overlap the lightly doped region. In this case, 'selectively' means that only the conductive film is partially removed from the side of the conductive film without removing the second gate electrode. Accordingly, during the forming of the first gate electrode, the first gate electrode can be formed such that it does not overlap the lightly doped region, and the second gate electrode can be formed such that it overlaps the lightly doped region in plan view. With the LDD structure in which the channel region, the lightly doped region, and the heavily doped region are formed in the semiconductor layer, and the light-shielding structure capable of shielding the lightly doped region from the light by the second gate electrode, the transistor can be formed. In addition, since the first gate electrode does not overlap the lightly doped region, it is possible to reduce the parasitic capacitance generated between the first gate electrode and the lightly doped region.

Accordingly, in the method of manufacturing an electro-optical device according to the second aspect of the invention, it is possible to form the transistor with the LDD structure capable of shielding the light from the lightly doped region through which the light leakage current can easily flow. Therefore, it is possible to manufacture an electro-optical device in which high-resolution image display can be achieved by making use of electrical characteristic by the LDD structure.

According to a third aspect of the invention, a method of manufacturing an electro-optical device includes, above a substrate, forming a plurality of data lines and a plurality of scanning lines that cross each other, forming conductive films to be first gate electrodes in predetermined regions of semiconductor layers that are formed above the substrate and forming second gate electrodes on the conductive films, doping impurities into the semiconductor layers using the second gate electrodes as masks so as to form impurity regions around the predetermined regions, selectively removing the conductive films from the sides of the conductive films so as to form first gate electrodes, forming sidewalls so as to cover at least a portion of regions of the impurity regions adjacent to the predetermined regions in a longitudinal direction of a channel of the transistor in the impurity regions, doping the impurities into outside regions of at least a portion of regions of the impurity regions adjacent to the predetermined regions while using the second gate electrodes and the sidewalls as masks so as to form heavily doped regions and lightly doped regions whose impurity concentrations are different from each other in the semiconductor layers, heating the semiconductor layers so as to enlarge the heavily doped regions the lightly doped regions, and forming a plurality of pixel electrodes so as to correspond to intersections between the plurality of data lines and the plurality of scanning lines.

In the method of manufacturing an electro-optical device according to the third aspect of the invention, the impurity region can be formed around the predetermined region by the forming of the conductive film and doping of the impurities in the semiconductor layer.

During the forming of the first gate electrode, the conductive film is removed from the side of the conductive film by using an etching method, such as, for example, an isotropic plasma treatment, and the first gate electrode is formed in the predetermined region.

During the forming of the sidewall, the sidewall is formed so as to cover at least a portion of the region of the impurity region adjacent to the predetermined region in the direction where the semiconductor layer extends. The sidewall may be formed so as to have a width corresponding to the width of the lightly doped region to be formed.

During the doping of the impurities, the heavily doped region and the lightly doped region are formed in the impurity region of the semiconductor layer. In this case, the impurities are doped in the outside region of at least the portion, that is, the region that finally becomes the heavily doped region. At this time, the sidewall serves as a mask such that the impurities are not further doped in at least the portion.

During the dispersing of the heavily doped region and the lightly doped region, the impurities are dispersed in the semiconductor layer by heating the semiconductor layer so as to enlarge the heavily doped region and the lightly doped region. Thereby, the heavily doped region and the lightly doped region, each of which has a size according to the design of the transistor, can be formed in the semiconductor layer. The dispersion speed of the impurities that disperse in the semiconductor layer is different according to the heat treatment conditions. The heat treatment conditions are set such that the impurities do not disperse to the region below the first gate electrode, that is, such that the region of the semiconductor layer below the first gate electrode becomes the channel region. Thereby, it is possible to form the transistor having the LDD structure.

In addition, in the method of manufacturing an electro-optical device according to the third aspect of the invention, since the lightly doped region can be shielded from the light by the sidewall and the second gate electrode, the light leakage current can be reduced.

Accordingly, in the method of manufacturing an electro-optical device according to the third aspect of the invention, it is possible to form the transistor with the LDD structure capable of shielding the light from the lightly doped region through which the light leakage current can easily flow. Therefore, it is possible to manufacture an electro-optical device in which high-resolution image display can be achieved by making use of electrical characteristic by the LDD structure.

According to a fourth aspect of the invention, a method of manufacturing an electro-optical device includes, above a substrate, forming a plurality of data lines and a plurality of scanning lines that cross each other, forming first gate electrodes so as to cover predetermined regions of semiconductor layers that are formed above the substrate, doping impurities into the semiconductor layers using the first gate electrodes as masks so as to form impurity regions around the predetermined regions, forming second gate electrodes on the first gate electrodes so as to cover the predetermined regions and at least a portion of regions of the impurity regions adjacent to the predetermined regions in a longitudinal direction of a channel of the transistor, doping the impurities into outside regions of at least the portion of regions of the impurity regions adjacent to the predetermined regions in the longitudinal direction of a channel of the transistor while using the second gate electrodes as masks so as to form heavily doped regions and lightly doped regions whose impurity concentrations are different from each other in the semiconductor layers, and forming a plurality of pixel electrodes so as to correspond to intersections between the plurality of data lines and the plurality of scanning lines.

In the method of manufacturing the electro-optical device according to the fourth aspect of the invention, during the forming of the first electrode, by using the conductive material, such as, polysilicon and the like, the first gate electrode is formed so as to cover the predetermined region of the semiconductor layer that is formed on the substrate.

During the doping of the impurities in the semiconductor layer, the impurities are doped in the semiconductor layer from the upper side of the first gate electrode, and the impurity region is formed around the predetermined region. That is, during the doping of the impurities in the semiconductor layer, the first gate electrode serves as a mask such that the impurities are not doped in the predetermined region.

During the forming of the second gate electrode on the first electrode, by using, for example, the metal silicide, the second gate electrode is formed on the first gate electrode so as to cover at least a portion of the region of the impurity region adjacent to the predetermined region in a longitudinal direction of the channel of the transistor, and the predetermined region. In this case, since the 'adjacent region' refers to a region finally becoming the lightly doped region, the light irradiated onto the adjacent region can be shielded by the second gate electrode covering the adjacent region.

During the doping of the impurities, the heavily doped region and the lightly doped region whose impurity concentrations are different from each other are formed in the semiconductor layer by doping the impurities in the outside region of the adjacent region while using the second gate electrode as a mask. That is, since the second gate electrode covers the region adjacent to the predetermined region, the impurities are not further doped in the adjacent region. Accordingly, the heavily doped region and the lightly doped region whose impurity concentrations are different from each other can be formed around the predetermined region that finally becomes the channel region of the transistor. In addition, during the doping of the impurities, an ion implantation angle when the impurities are doped is made to be about ±5°, and thus the heavily doped region can be formed by a self-assembling manner according to the width of the second gate electrode, that is, a so-called self alignment.

As such, in the method of manufacturing an electro-optical device according to the fourth aspect of the invention, the light shielding can be made by the second gate electrode such that light is not irradiated onto the lightly doped region through which the light leakage current may easily flow, the heavily doped region can be formed with a self alignment, and the transistor having the LDD structure can be manufactured by the simple processes so as to have a high performance.

Preferably, the method of manufacturing an electro-optical device according to the second aspect of the invention further includes before the forming of the second electrodes, forming insulating films so as to cover the impurity regions and the first gate electrodes, polishing the insulating films until the first gate electrodes are exposed, and causing polished surfaces of the polished insulating films and exposed surfaces of the first gate electrodes exposed to the polished surfaces to be flush with each other.

According to this aspect, the second gate electrode can be formed over the polished surface of the insulating film polished by a polishing method, such as a chemical mechanical polishing (CMP) method, and the exposed surface of the first gate electrode exposed to the polished surface. Accordingly, during the forming of the second electrode, it is possible to form the second gate electrode that is made of metal silicide so as to have excellent quality with defects minimized.

Preferably, during the forming of the second electrodes, the second gate electrodes are electrically connected to portions of the first gate electrodes that extend to the outside regions of the predetermined regions in a direction crossing a longitudinal direction of a channel of the transistor in plan view.

According to this aspect, when the contact hole is formed in the insulating film, it is possible to suppress the first gate electrode from being damaged, and the first gate electrode and the second gate electrode can be electrically connected to each other while maintaining the excellent quality of the first gate electrode.

Preferably, before the forming of the second electrodes, forming insulating films so as to cover the impurity regions and the first gate electrodes, and forming openings to which at least portions of surfaces of the first gate electrodes are exposed by removing portions of the insulating films. During the forming of the second electrode, the second gate electrode may be formed on at least a portion of the surface such that it is electrically connected to the first gate electrode.

According to this aspect, since the first gate electrode exposed to the opening can be electrically connected to the second gate electrode, the insulating film covering the first gate electrode does not need to be removed by using a polishing method, such as, for example, a CMP method. Thereby, when the first gate electrode has a very small thickness of nanometer order, it is possible to effectively suppress the first gate electrode from being damaged due to the polishing method, such as the CMP method.

Preferably, during the forming of the openings, protrusions of the insulating films that protrude on the first gate electrodes are partially removed.

According to this aspect, since the surface of the protrusion can be made to be smooth, it is possible to improve coverage of the insulating film and the second gate electrode on the insulating film.

According to a fifth aspect of the invention, an electronic apparatus includes the above-described electro-optical device.

The electronic apparatus according to the fifth aspect of the invention includes the above-mentioned electro-optical device. Therefore, it is possible to achieve various electronic apparatuses, such as a projection display device, a cellular phone, an electronic note, a word processor, a view-finder-type or monitor-direct-view video tape recorder, a workstation, a video phone, a POS terminal, and a touch panel, in which high-resolution display can be made. Further, as another example of the electronic apparatus, an electrophoresis device, such as, for example, an electronic paper and the like, can be achieved.

The advantages and other effects can be apparent from the following preferred embodiments.

BRIEF DESCRIPTION OF THE DRAWINGS

The invention will be described with reference to the accompanying drawings, wherein like numbers reference like elements.

FIG. 8 is a cross-sectional view illustrating a first process of manufacturing an electro-optical device according to a first embodiment of the invention.

FIG. 9 is a cross-sectional view illustrating a second process of manufacturing an electro-optical device according to a first embodiment of the invention.

FIG. 10 is a cross-sectional view illustrating a third process of manufacturing an electro-optical device according to a first embodiment of the invention.

FIG. 11 is a cross-sectional view illustrating a fourth process of manufacturing an electro-optical device according to a first embodiment of the invention.

DESCRIPTION OF EXEMPLARY EMBODIMENTS

Hereinafter, an electro-optical device according to a first aspect of the invention, methods of manufacturing electro-optical devices according to second, third, and fourth aspects of the invention, and various examples of an electronic apparatus will be described with reference to the accompanying drawings. In the preferred embodiments to be described below, an electro-optical device is applied to a liquid crystal device.

First Embodiment

First, an electro-optical device according to a first aspect of the invention, and a method of manufacturing an electro-optical device according to a second aspect of the invention will be described with reference to FIGS. 1 to 12.

Entire Structure of Electro-Optical Device

Figure 1:
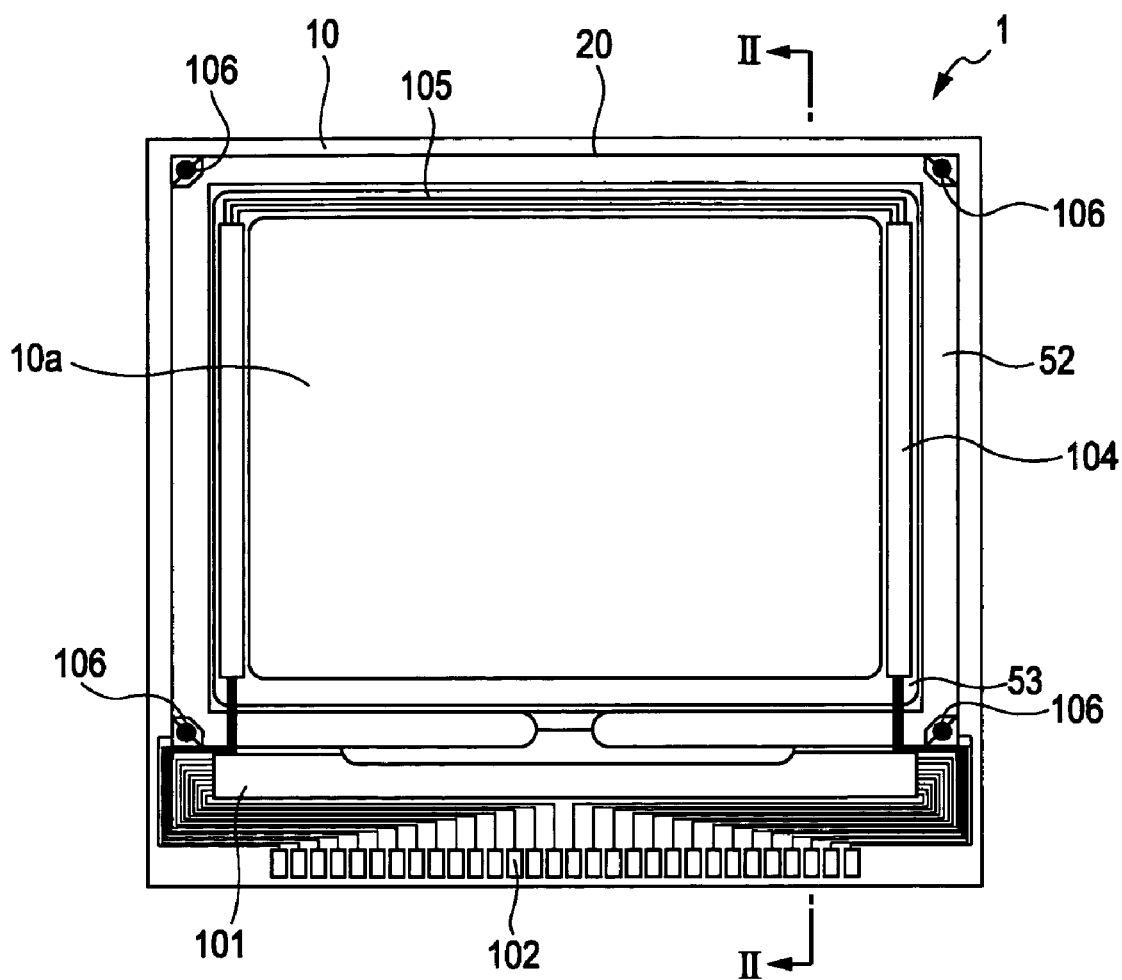
FIG. 1 is a plan view illustrating an electro-optical device according to a first embodiment of the invention.
Figure 2:
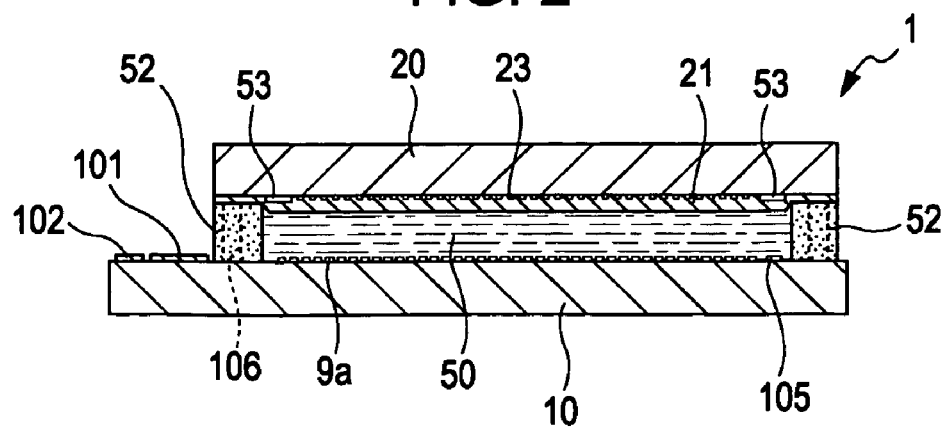
FIG. 2 is a cross-sectional view taken along the line II-II of FIG. 1.

An electro-optical device according to a first embodiment of the invention will be described with reference to FIGS. 1 and 2. FIG. 1 is a plan view illustrating a TFT array substrate and various essential elements formed on the TFT array substrate in the electro-optical device according to the first embodiment of the invention when viewed from a counter substrate side. FIG. 2 is a cross-sectional view taken along the line of FIG. 1. In this embodiment, as an example of the electro-optical device, a TFT-active-matrix-driven liquid crystal device having a built-in driving circuit will be exemplified.

In FIGS. 1 and 2, in a liquid crystal device 1, a TFT array substrate 10 is opposite to a counter substrate 20. Further, a liquid crystal layer 50 is interposed between a TFT array substrate 10 and a counter substrate 20. The TFT array substrate 10 and the counter substrate 20 are bonded to each other by a sealant 52 provided in a sealing region around an image display region 10a that is a pixel region where a plurality of pixel portions are provided.

The sealant 52 that bonds the TFT array substrate 10 and the counter substrate 20 to each other is made of resin materials, such as, for example, an ultraviolet curable resin, a thermosetting resin, and the like, which are applied on the TFT array substrate 10 and then cured by ultraviolet ray irradiation or heating in manufacturing processes. In addition, a gap material made of materials, such as glass fiber or glass bead, is dispersed in the sealant 52 to maintain the gap between the TFT array substrate 10 and the counter substrate 20 (the gap between the substrates) at a predetermined interval. Therefore, the electro-optical device according to the first embodiment is used for a light value of a projector as a small-sized device and suitable for enlarging and displaying images.

A frame-shaped light-shielding film 53 having a light-shielding property that extends parallel to the inside of the sealing region where the sealant 52 is disposed so as to define a frame region of an image display region 10a is provided on a side of a counter substrate 20. However, a portion or all of the frame-shaped light-shielding film 53 may be provided as a built light-shielding film at the side of the TFT array substrate 10. Further, a peripheral region exists around the image display region 10a. That is, in the first embodiment, when viewed from the center of the TFT array substrate 10, a region away from the frame-shaped light-shielding film 53 is defined as the peripheral region.

Among the peripheral region, in a region located outside the sealing region where the sealant 52 is disposed, a data line driving circuit 101 and external circuit connecting terminals 102 are provided along one side of the TFT array substrate 10. Further, scanning line driving circuits 104 are provided so as to be covered with the frame-shaped light-shielding film 53 along two sides adjacent to the one side. Furthermore, a plurality of wiring lines 105 are provided along the remaining side of the TFT array substrate 10 so as to connect the two scanning line driving circuits 104 that are provided at both sides of the image display region 10a and to be covered with the frame-shaped light-shielding film 53.

Upper and lower conductive members 106 that serve as upper and lower conductive terminals between the two substrates are disposed at four corners of the counter substrate 20. Meanwhile, in the TFT array substrate 10, upper and lower conductive terminals are provided in regions opposite to the corners. Thereby, the TFT array substrate 10 and the counter substrate 20 can be electrically connected to each other.

In FIG. 2, after pixel switching TFTs or wiring lines, such as the scanning lines and the data lines, are formed on the TFT array substrate 10, an alignment film is formed on pixel electrode 9a. Meanwhile, on the counter substrate 20, the counter electrode 21 is formed, light-shielding films 23 are formed in a matrix or stripes, and an alignment film is formed on the uppermost layer of the counter substrate. Further, the liquid crystal layer 50 is made of liquid crystal in which a kind or more of nematic liquid crystal is mixed. A predetermined alignment state is maintained between the pair of alignment films.

Further, on the TFT array substrate 10 shown in FIGS. 1 and 2, in addition to driving circuits, such as the data line driving circuit 101 and the scanning line driving circuits 104, a sampling circuit that samples image signals on image signal lines to supply them to data lines, a precharge circuit that supplies precharge signals of predetermined voltage levels to the plurality of data lines before supplying the image signals, a test circuit that tests the quality or defect of the electro-optical device during the manufacturing process of the liquid crystal device or at the time of shipment of the liquid crystal device, and the like may be formed.

Structure of Pixel Portion

Figure 3:
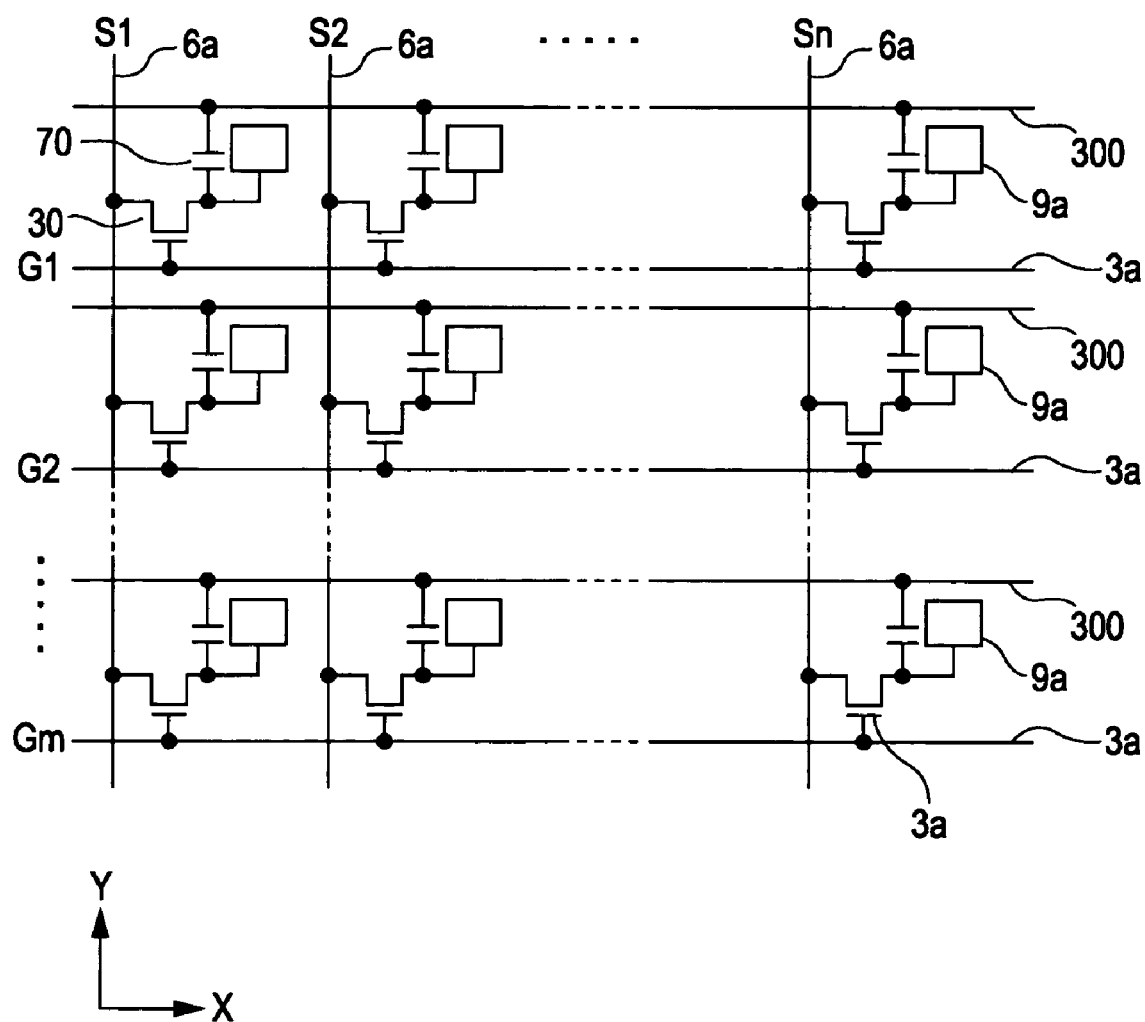
FIG. 3 is an equivalent circuit diagram of various elements, wiring lines, and the like in a pixel of an electro-optical device according to a first embodiment of the invention.
Figure 4:
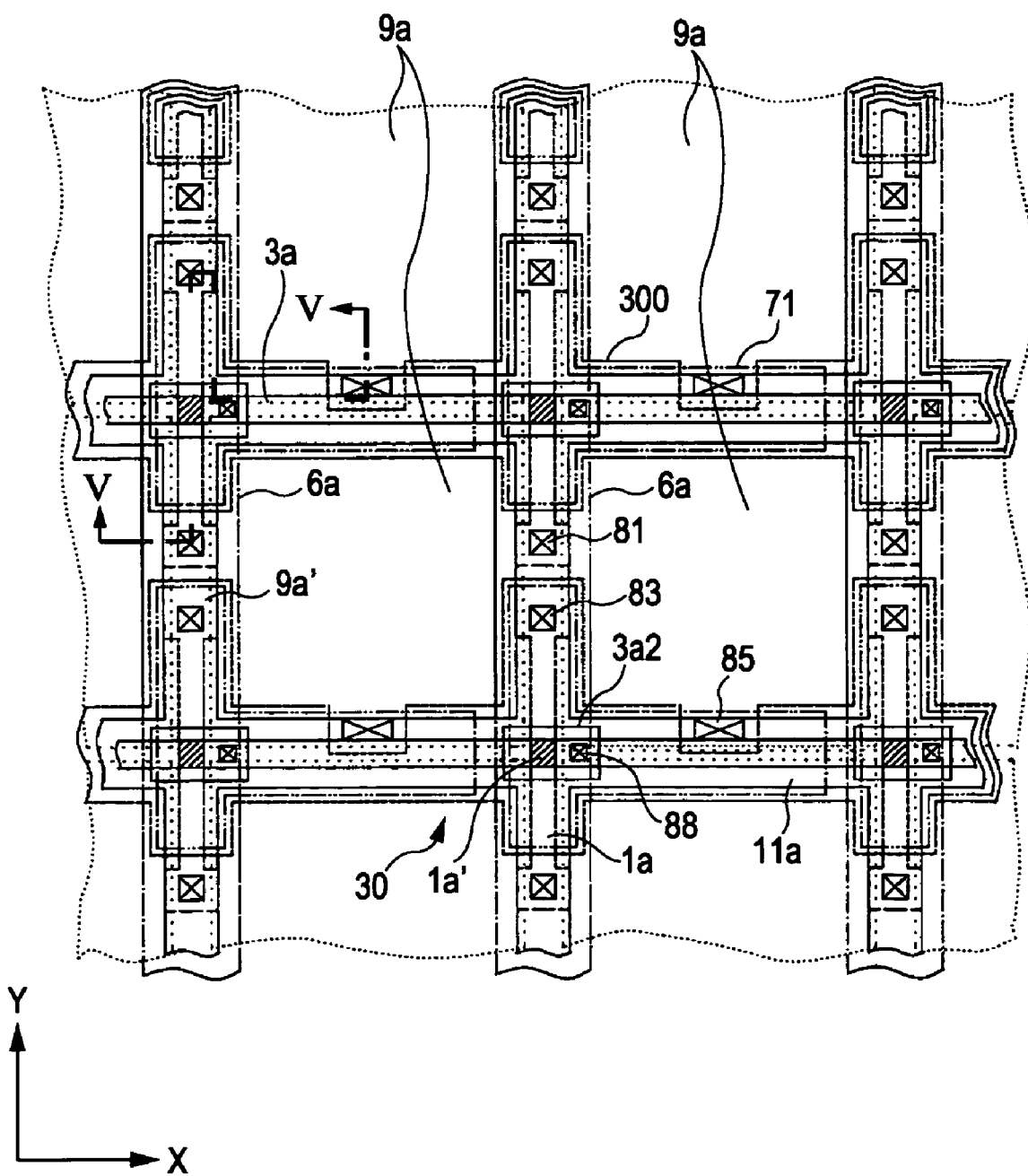
FIG. 4 is a plan view illustrating a plurality of adjacent pixel groups in a TFT array substrate.
Figure 5:
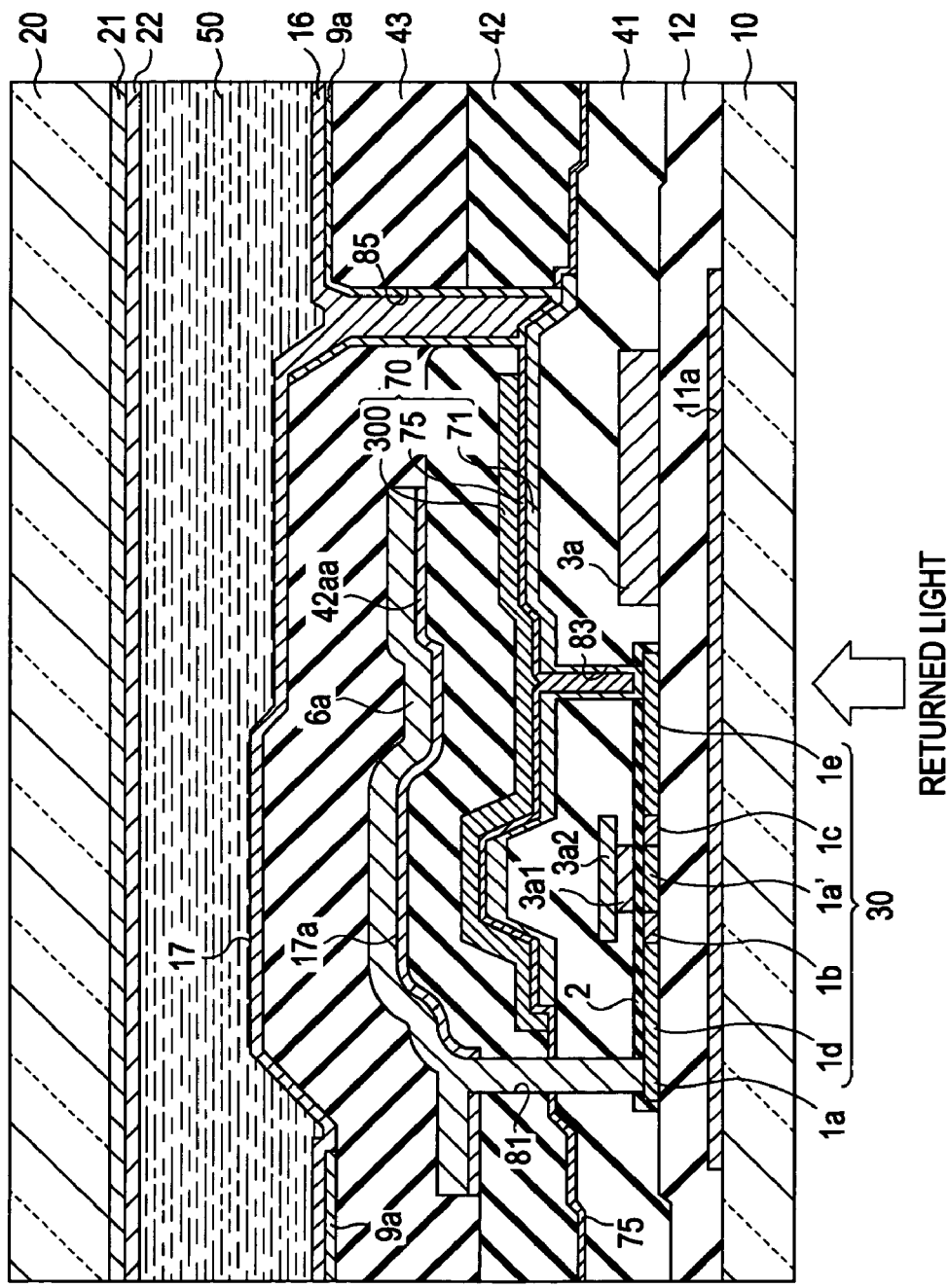
FIG. 5 is a cross-sectional view taken along the line V-V of FIG. 4.

Next, a structure of a pixel portion of the liquid crystal device 1 will be described in detail with reference to FIGS. 3 and 5. FIG. 3 is an equivalent circuit diagram of various elements, wiring lines, and the like in a plurality of pixels that are formed in a matrix so as to form an image display region of the liquid crystal device 1. FIG. 4 is a plan view illustrating a plurality of adjacent pixel groups in the TFT array substrate where data lines, scanning lines, pixel electrodes, or the like are formed. FIG. 5 is a cross-sectional view taken along the line V-V of FIG. 4. In FIG. 5, the scale of each layer or member has been adjusted in order to have a recognizable size in the drawings.

In FIG. 3, in each of the plurality of pixels that are formed in a matrix so as to form the image display region of the liquid crystal device 1, a pixel electrode 9a, and a TFT 30 that is an example of a 'transistor' according to the first embodiment are formed. The TFT 30 is electrically connected to the pixel electrode 9a, and controls a switching operation of the pixel electrode 9a at the time of operating the liquid crystal device 1. The data line 6a supplied with an image signal is electrically connected to a source of the TFT 30. Meanwhile, image signals S1, S2, . . . , and Sn that are written in the data lines 6a may be line-sequentially supplied or may be supplied for each group consisting of a plurality of adjacent data lines 6a.

The scanning line 3a is electrically connected to a gate of the TFT 30. The liquid crystal device 1 is constructed such that scanning signals G1, G2, . . . , and Gm are line-sequentially applied to the scanning lines 3a with a predetermined timing in a pulsed manner. The pixel electrode 9a is electrically connected to a drain of the TFT 30, and allows the TFT 30 serving as a switching element to be turned on for a predetermined period, such that the image signals S1, S2, . . . , and Sn supplied from the data lines 6a are written with a predetermined timing. The image signals S1, S2, . . . , and Sn of the predetermined levels that are written in the liquid crystal as an example of an electro-optical material through the pixel electrodes 9a are held for a predetermined period between the pixel electrodes and the counter electrode formed on the counter substrate. The alignment or order of liquid crystal molecule aggregate varies by a level of an applied voltage, and thus the liquid crystal modulates light to allow gray-scale display to be performed. In a normally white mode, transmittance with respect to incident light is decreased according to an applied voltage in a unit of each pixel, and in a normally black mode, transmittance with respect to incident light is increased according to an applied voltage in a unit of each pixel. As a whole, light having contrast according to an image signal is emitted from an electro-optical device.

In this case, in order to prevent the held image signal from leaking, a storage capacitor 70 is additionally provided parallel to a liquid crystal capacitor that is formed between the pixel electrode 9a and the counter electrode.

Next, a specific structure of a pixel portion will be described with reference to FIGS. 4 and 5. In FIG. 4, on the TFT array substrate 10 of the liquid crystal device 1, a plurality of transparent pixel electrodes 9a (whose outlines are shown by dotted lines 9a') are provided in a matrix in an X direction and a Y direction. Further, the data lines 6a and the scanning lines 3a are provided along the interfaces of the pixel electrodes 9a in horizontal and vertical directions.

The scanning line 3a is disposed so as to be opposite to a channel region 1a' of the semiconductor layer 1a shown in a rightward elevated oblique region of FIG. 4. As such, a TFT 30 for pixel switching is provided so as to correspond to an intersection between each scanning line 3a and each data line 6a. In this embodiment, the scanning line 3a is electrically connected to a second gate electrode 3a2 through a through hole 88 that penetrates a first interlayer insulating film 41.

The second gate electrode 3a2 is formed to be wider than the channel region 1a' in a Y direction in the drawing in plan view. Although not shown in FIG. 4, the second gate electrode 3a2 covers a lightly doped source region 1b and a lightly doped drain region 1c as an example of a 'lightly doped region' that is formed on the semiconductor layer 1a.

The data line 6a is formed by using a second interlayer insulating film 42 whose top surface is planarized as a base. The data line 6a is electrically connected to a heavily doped source region of the TFT 30 through a contact hole 81. An inner portion of each of the data line 6a and the contact hole 81 is made of, for example, a material containing aluminum (Al), such as Al—Si—Cu, Al—Cu, and the like, or an Al simplex, or a multilayered film having an Al layer, a TiN layer, and the like. The data line 6a has a function of shielding the TFT 30 from the light.

The storage capacitor 70 is formed by disposing a lower capacitor electrode 71 and a portion of an upper capacitor electrode 300 to be opposite to each other with a dielectric film 75 interposed therebetween. The lower capacitor electrode 71 serves as a pixel-potential-side capacitor electrode that is connected to a heavily doped drain region 1e as an example of a 'heavily doped region' of the TFT 30 and the pixel electrode 9a, and the upper capacitor electrode 300 serves as a fixed-potential-side capacitor electrode.

As shown in FIGS. 4 and 5, the upper capacitor electrode 300 that is an example of a 'light-shielding film' of the first embodiment is provided on the TFT 30 as an upper light-shielding film (built light-shielding film) containing, for example, a metal or an alloy. The upper capacitor electrode 300 functions as a fixed-potential-side capacitor electrode. The upper capacitor electrode 300 is made of any one of a metal simplex, an alloy, metal silicide, polysilicide, laminators thereof, and the like that contain at least one of high melting metals, such as, for example, titanium (Ti), chromium (Cr), tungsten (W), tantalum (Ta), molybdenum (Mo), palladium (Pd), and the like. The upper capacitor electrode 300 may contain another metal, such as aluminum (Al), silver (Ag), and the like. The upper capacitor electrode 300 may have a multilayered structure that includes a first film made of, for example, a conductive polysilicon film, and the like, and a second film made of a metal silicide film containing a high melting metal and the like.

The lower capacitor electrode 71 is made of, for example, a conductive polysilicon film, and serves as a pixel-potential-side capacitor electrode. In addition to the function as the pixel-potential-side capacitor electrode, the lower capacitor electrode 71 functions as another example of a light absorbing layer or an upper light shielding film that is disposed between the upper capacitor electrode 300 serving as the upper light-shielding film and the TFT 30. However, similar to the upper capacitor electrode 300, the lower capacitor electrode 71 may also be made of a single layer containing a metal or an alloy or a multilayered film.

The dielectric film 75 is provided between the lower capacitor electrode 71 and the upper capacitor electrode 300, each of which serves as a capacitor electrode. The dielectric film 75 is made of a silicon oxide film, such as, for example, a high temperature oxide (HTO) film, a low temperature oxide (LTO) film, and the like, or a silicon nitride film and the like.

The upper capacitor electrode 300 extends from the image display region 10a where the pixel electrodes 9a are disposed to peripheral regions of the image display region 10a. The upper capacitor electrode 300 is electrically connected to a constant potential source, and the potential of the upper capacitor electrode 300 is fixed.

A lower light-shielding film 11a, which is provided in a matrix below the TFT 30 with a base insulating film 12 interposed therebetween, shields the channel region 1a' of the TFT 30 and peripheral regions thereof from returned light incident on the inside of the liquid crystal device from the side of the TFT array substrate 10. Similar to the upper capacitor electrode 300, the lower light-shielding film 11a is made of any one of a metal simplex, an alloy, metal silicide, polysilicide, laminators thereof, and the like that contain at least one of high melting metals, such as, for example, titanium (Ti), chromium (Cr), tungsten (W), tantalum (Ta), molybdenum (Mo), palladium (Pd), and the like.

The base insulating film 12 has a function of insulating the TFT 30 from the lower light-shielding film 11a. In addition, the base insulating film 12 is formed on an entire surface of the TFT array substrate 10, and has a function of preventing characteristic of the TFT 30 for pixel switching from being degraded due to roughness when a surface of the TFT array substrate 10 is polished, or dusts remaining after a cleaning process. The pixel electrode 9a relays the lower capacitor electrode 71 so as to be electrically connected to the heavily doped drain region 1e of the semiconductor layer 1a through the contact holes 83 and 85.

As shown in FIGS. 4 and 5, the liquid crystal device 1 includes a transparent TFT array substrate 10, and a transparent counter substrate 20 that is opposite to the transparent TFT array substrate 10. The TFT array substrate 10 is formed of any one of, for example, a quartz substrate, a glass substrate, and a silicon substrate, and the counter substrate 20 is formed of, for example, a glass substrate or a quartz substrate.

On the TFT array substrate 10, the pixel electrode 9a is provided, and an alignment film 16 having been subjected to a predetermined alignment process, such as a rubbing process and the like, is provided on the pixel electrode 9a. For example, the pixel electrode 9a is made of a transparent conductive film, such as an indium tin oxide (ITO) film and the like, and the alignment film 16 is made of an organic film, such as a polyimide film and the like.

The counter electrode 21 is provided over an entire surface of the counter substrate 20, and an alignment film 22 having been subjected to a predetermined alignment process, such as a rubbing process and the like, is provided below the counter electrode 21. The counter electrode 21 is made of a transparent conductive film, such as, for example, an ITO film and the like. The alignment film 22 is made of an organic film, such as a polyimide film and the like.

On the counter substrate 20, light-shielding films may be provided in a matrix or stripes. By adopting this configuration, by using the upper light-shielding film provided as the upper capacitor electrode 300, it is possible to reliably prevent incident light from the side of the TFT array substrate 10 from permeating into the channel region 1a' of the TFT 30 and peripheral regions thereof.

In addition to the above-mentioned structure, a liquid crystal layer 50 is formed between the TFT array substrate 10 and the counter substrate 20 on which the pixel electrode 9a and the counter electrode 21 are disposed to be opposite to each other. The liquid crystal layer 50 assumes a predetermined alignment state by the alignment films 16 and 22 in a state in which an electric field is not applied from the pixel electrode 9a.

In FIG. 5, the TFT 30 for pixel switching has a lightly doped drain (LDD) structure. The TFT 30 has a first gate electrode 3a1, a second gate electrode 3a2, a channel region 1a' of the semiconductor layer 1a in which a channel is formed by an electric field from the scanning line 3a, an insulating film 2 including a gate insulating film that insulates the scanning line 3a and the semiconductor layer 1a from each other, a lightly doped source region 1b and a lightly doped drain region 1c, and a heavily doped source region 1d and a heavily doped drain region 1e. Each of the lightly doped source region 1b and the lightly doped drain region 1c corresponds to an example of the 'lightly doped region' of the present embodiment, and each of the heavily doped source region 1d and the heavily doped drain region 1e corresponds to an example of the 'heavily doped region' of the present embodiment. The lightly doped source region 1b, the lightly doped drain region 1c, and the heavily doped source region 1d, and the heavily doped drain region 1e form an impurity region of the semiconductor layer 1a, and they are formed in a manner of mirror symmetry at both sides of the channel region 1a'.

The first gate electrode 3a1 is formed of a conductive film, such as a polysilicon film and the like, and it is provided on the channel region 1a' with an insulating film 2 interposed therebetween, such that it does not overlap the lightly doped source region 1b and the lightly doped drain region 1c. Accordingly, in the TFT 30, offset between the heavily doped source region 1d and the heavily doped drain region 1e, and the first gate electrode 3a1 is sufficiently ensured.

The edge of the first gate electrode 3a1 overlaps the interface between the lightly doped source region 1b, the lightly doped drain region 1c, and the channel region 1a in plan view. A parasitic capacitance generated between the lightly doped source region 1b and the lightly doped drain region 1c, and the first gate electrode 3a1 is reduced. Thereby, high-speed operation of the TFT 30 can be achieved, thereby improving the display performance of the liquid crystal device 1.

The second gate electrode 3a2 made of a conductive material, such as metal silicide and the like, is provided on the first gate electrode 3a1 such that it covers the lightly doped source region 1b and the lightly doped drain region 1c in plan view. That is, the gate electrode of the TFT 30 has a multilayered structure that includes the first gate electrode 3a1 and the second gate electrode 3a2. The second gate electrode 3a2 shields the lightly doped source region 1b and the lightly doped drain region 1c from the light, such that the incident light irradiated from a light source, such as a backlight and the like, is not irradiated onto the lightly doped source region 1b and the lightly doped drain region 1c. Thereby, a light leak current that flows through the lightly doped source region 1b and the lightly doped drain region 1c is reduced. In addition, since the second gate electrode 3a2 is formed on the semiconductor layer 1a with the first gate electrode 3a1 interposed therebetween, the second gate electrode 3a2 can effectively shields the lightly doped source region 1b and the lightly doped drain region 1c from the light at a closer locations, as compared with a case in which a light-shielding film is disposed on the TFT 30.

Terminating ends of the second gate electrode 3a2 align with terminating ends of the lightly doped source region 1b and the lightly doped drain region 1c, and terminating ends of the heavily doped source region 1d and the heavily doped drain region 1e, in plan view. Accordingly, a parasitic capacitance generated between the heavily doped source region 1d and the heavily doped drain region 1e, and the second gate electrode 3a2 is reduced. Thereby, high-speed operation of the TFT 30 can be achieved, thereby improving display performance of the liquid crystal device 1.

In addition, in the liquid crystal device 1, the lightly doped source region 1b and the lightly doped drain region 1c can be effectively shielded from the light by the upper capacitor electrode 300 formed on the second gate electrode 3a2 so as to cover the TFT 30, as compared with a case in which the lightly doped source region 1b and the lightly doped drain region 1c are shielded from the light by only the second gate electrode 3a2.

As such, according to the liquid crystal device 1 having the above-mentioned embodiment, a display defect, such as a flicker, occurring when the image display is performed, can be reduced by using the TFT 30 in which a light leakage current is reduced, thereby achieving high-resolution image display. In addition, since the TFT 30 has an LDD structure, an off current that flows through the lightly doped source region 1b and the lightly doped drain region 1c when the TFT 30 does not operate is reduced, and the reduction of an on current flowing when the TFT 30 operates is suppressed. Therefore, according to the liquid crystal device 1, by using advantages of the LDD structure and an advantage that a light leakage current rarely flows, high-resolution image display can be achieved.

A first interlayer insulating film 41 is formed on the scanning line 3a. In the first interlayer insulating film 41, a contact hole 81 communicating with the heavily doped source region 1d and a contact hole 83 communicating with the heavily doped drain region 1e are formed.

On the first interlayer insulating film 41, the lower capacitor electrode 71 and the upper capacitor electrode 300 are formed, and the second interlayer insulating film 42 in which the contact holes 81 and 85 are provided is formed on the lower capacitor electrode 71 and the upper capacitor electrode 300.

The second interlayer insulating film 42 according to the first embodiment is made of, for example, a borophosphosilicate glass (BPSG) film. The second interlayer insulating film 42 suffers from a fluidization state by a heating treatment, and thus its top surface is planarized. That is, at the time of forming the second interlayer insulating film 42, since a storage capacitor 70 at the lower layer side, the TFT 30, the scanning line 3a, and the base insulating film 11a exist on the top surface of the second interlayer insulating film 42, a step is generated. However, a fluidizing process is performed, and thus unevenness due to the step becomes uniform on the top surface of the second interlayer insulating film 42.

The top surface of the second interlayer insulating film 42 is not completely flat, and the a stepped portion 17a remains on the top surface of the second interlayer insulating film 42 due to the scanning line 3a and the like. The stepped portion 17a remains intentionally for preventing a lateral electric field, propagates up to a top surface of the alignment film 16, forms a stepped portion 17 having a predetermined height in a light-shielding region that is an interface between the pixels, and reduces a lateral electric field between the pixels that is generated when the pixels are driven.

Further, in order to cover a region ranging from a top surface of the data line 6a to an entire surface of the second interlayer insulating film 42, a third interlayer insulating film 43 where the contact hole 85 is provided is formed of, for example, a BPSG film. The pixel electrode 9a and the alignment film 16 are provided on the top surface of the third interlayer insulating film 43.

Modification

Figure 6:
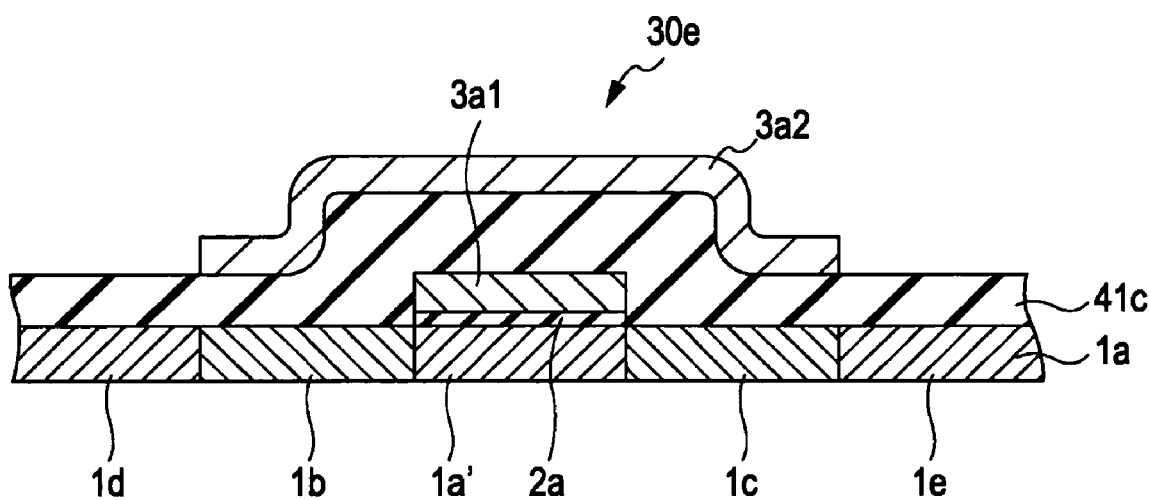
FIG. 6 is a cross-sectional view of a TFT included in an electro-optical device according to a modification of a first embodiment of the invention.

Next, an electro-optical device according to a modification of the first embodiment will be described with reference to FIGS. 6 and 7. In the electro-optical device according to the modification, since a structure of a TFT 30e is different from that in the above-mentioned electro-optical device, the structure of the TFT 302e will be mainly described. FIG. 6 is a cross-sectional view illustrating a structure of the TFT 30e included in the electro-optical device according to the modification. FIG. 12 is a plan view of the electro-optical device according to the modification, which corresponds to FIG. 4.

Figure 7:
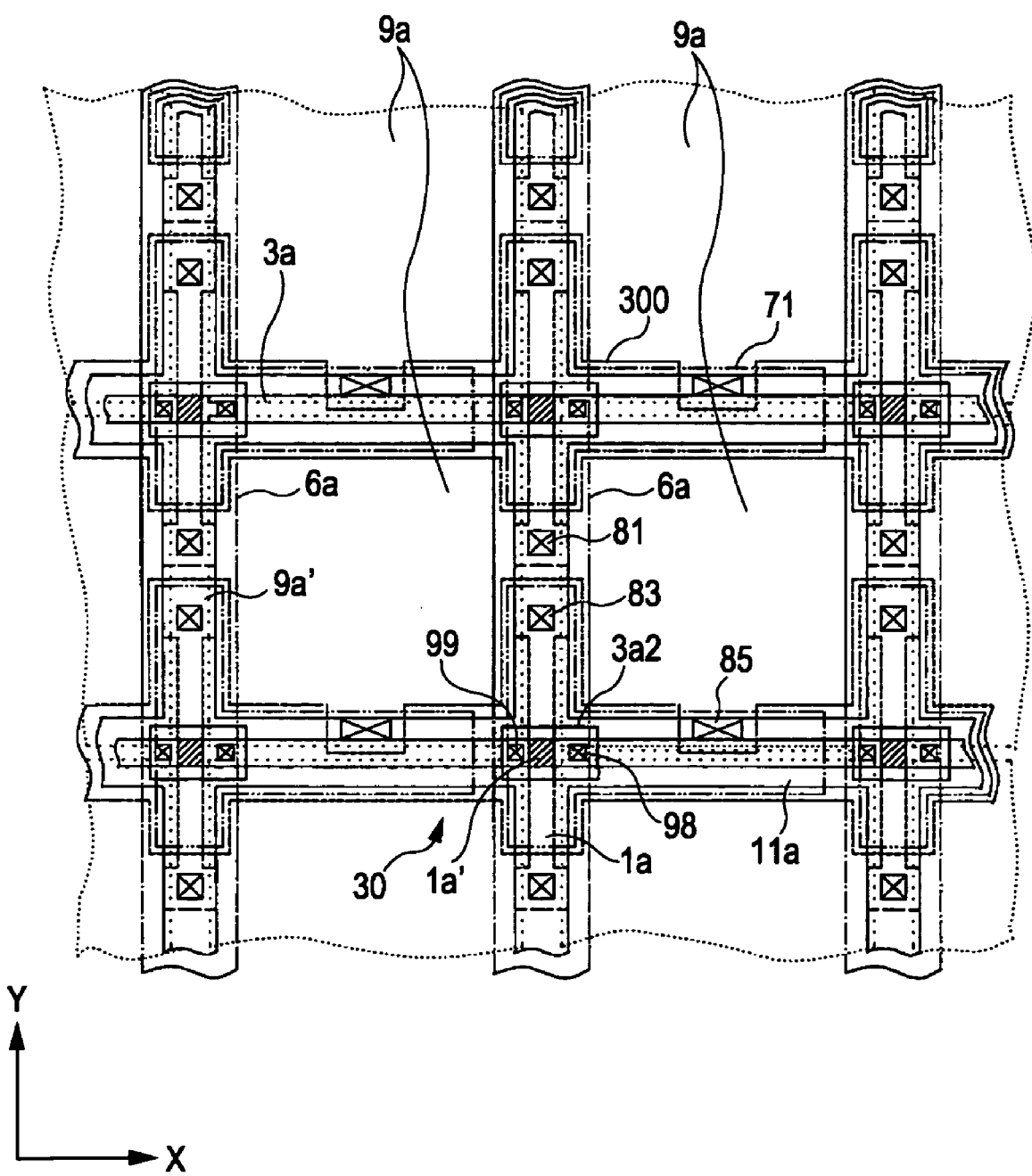
FIG. 7 is a plan view illustrating an electro-optical device according a modification, which corresponds to FIG. 4.

As shown in FIG. 6, in the TFT 30e included in the electro-optical device according to the modification, the second gate electrode 3a2 is not electrically connected to a top surface of the channel region 1a', and it is electrically connected to a portion of the first gate electrode 3a1 that extends to the outside region of the channel region 1a', as shown in FIG. 7. Specifically, in a region for avoiding the channel region 1a', the first gate electrode 3a1 and the second gate electrode 3a2 are electrically connected to each other through the contact hole 98 that is formed in the first interlayer insulating film 41. The second gate electrode 3a2 is electrically connected to the scanning line 3a through the contact hole 99. By using this TFT 30e, a light leakage current is reduced, thereby achieving high-resolution image display in the electro-optical device. In addition, it is possible to reduce an overetching amount of the first gate electrode by an etching process used when an opening is formed in the insulating film for electrically connecting the first gate electrode and the second gate electrode. Further, the first gate electrode and the second gate electrode can be reliably electrically connected to each other.

Method of Manufacturing Electro-Optical Device

Next, a method of manufacturing an electro-optical device according to a second aspect of the invention will be described with reference to FIGS. 8 to 12. FIGS. 8 to 11 are cross-sectional views illustrating respective processes of a method of manufacturing an electro-optical device according to the present embodiment. FIG. 12 is a cross-sectional view specifically illustrating a process of manufacturing the TFT 30. According to the method of manufacturing the electro-optical device according the present embodiment, the above-mentioned liquid crystal device 1 can be manufactured. In the description below, processes of manufacturing the alignment film 22 or the counter electrode 21 formed on the counter substrate 20 are omitted.

In FIG. 8A, a substrate 10, such as, for example, a silicon substrate, a quartz substrate, a glass substrate, and the like, is prepared. It is desirable that the substrate 10 be subjected to a heat treatment at a temperature in the range of about 850 to 1300° C., more preferably at a temperature of 1000° C., in an inert gas ambient, such as $N_2$ (nitrogen), and then subjected to a pretreatment so as to minimize the distortion occurring in the substrate 10 during high temperature processes, which will be performed later.

Then, metals, such as, for example, Ti, Cr, W, Ta, Mo, and Pd, or an alloy of metals, such as a metal silicide, is deposited over an entire surface of the substrate 10 by means of a sputtering method or the like, thereby forming a light-shielding film having a thickness of 100 to 500 nm, and preferably about 200 nm. Then, a lower light-shielding film 11a having patterns shown in FIG. 4 is formed by, for example, a photolithographic method or an etching process.

Then, a base insulating film 12 made of silicate glass, such as PSG, BSP, BPSG, and the like in which a non-silicate glass (NSG) or phosphorus (P) or boron (B) is doped, silicon nitride, or silicon oxide is formed on the lower light-shielding film 11a by means of an atmospheric pressure or reduced-pressure CVD method using, for example, a tetraethyl orthosilicate (TEOS) gas, a tetraethyl borate (TEB) gas, a tetramethyl oxyphosphate (TMOP) or the like.

Then, an amorphous silicon film is formed on the base insulating film 12 by the reduced-pressure CVD method, and then subjected to the heat treatment, which causes a polysilicon film to be subjected to solid-phase growth. Alternatively, the polysilicon film is directly formed by the reduced-pressure CVD method without using the amorphous silicon film. Next, photolithography and etching are performed with respect to the polysilicon film so as to form a semiconductor layer 1*a* having a predetermined pattern, and an insulating film 2 becoming a gate insulating film 2 is formed by subjecting thermal oxidation to the polysilicon film. As a result, the thickness of the semiconductor layer 1*a* is within a range of about 30 to 150 nm, and preferably within a range of about 35 to 50 nm. The thickness of the insulating film 2 is within a range of about 20 to 150 nm, and preferably within a range of about 30 to 100 nm.

Then, impurity ions are gradually doped in the semiconductor layer 1*a*, thereby forming a semiconductor layer 1*a* of a pixel switching TFT 30 having an LDD structure that includes the lightly doped source region 1*b* and the lightly doped drain region 1*c*, and the heavily doped source region 1*d* and the heavily doped drain region 1*e*. As a result, the TFT 30 is formed. Further, processes of forming the TFT 30 will be described in detail below.

Then, in FIG. 8B, for example, similar to the base insulating layer 12, the first interlayer insulating film 41 is formed. On the top surface of the first interlayer insulating film 41, unevenness is formed according to the shape of the TFT 30, as shown in FIG. 8B.

Then, in FIG. 8C, a storage capacitor 70 is formed. First, a contact hole 83 is formed in the first interlayer insulating film 41 by using, for example, a dry etching method or a wet etching method or a combination thereof. Then, for example, the polysilicon film is deposited by the reduced-pressure CVD method, thermal diffusion using phosphor (P) is performed in the polysilicon film, and the polysilicon film is made to have conductivity, thereby a lower capacitor electrode 71. Further, a dielectric film 75 having a high temperature oxidization silicon film (HTO film) or a silicon nitride film is deposited with a relatively small thickness of about 50 nm by means of a reduced-pressure CVD method, a plasma CVD method, and the like, and then metals such as, for example, Ti, Cr, W, Ta, Mo, Pd, and the like, or a metal alloy film, such as metal silicide and the like, is subjected to sputtering, thereby forming an upper capacitor electrode 300. In this way, the storage capacitor 70 is formed.

Then, in FIG. 9A, for example, a precursor film of the second interlayer insulating film 42 is formed as a BPSG film 421 by using an atmospheric pressure CVD method. The precursor film 421 is formed such that a concentration ratio (percent by weight) between phosphor (P) and boron (B) contained in the BPSG film 421 satisfies the condition P: B=5:4. The precursor film 421 is formed so as to have a thickness of, for example, 800 nm.

Then, in FIG. 9B, the precursor film 421 is fluidized by heating, and then a planarizing process is performed on the precursor film 421. Specifically, for example, the substrate 10 is heated to the temperature of about 850° C. for 30 to 40 minutes, and the precursor film 421 is melted so as to reflow. As a result, the step is made to be alleviated on the surface of the precursor film 421.

Moreover, in the above-mentioned reflow process, the surface of the precursor film 421 is deteriorated. As a result, on the surface of the precursor film 421, a curing layer 42*aa* is formed with a thickness d within a range of, for example, 50 to 100 nm.

Then, in FIG. 10*a*, a conductive film 6*aa* is formed so as to form the data line 6*a* on the curing layer 42*aa*.

Then, a contact hole 81 is formed in the precursor film 421 where the curing layer 42*aa* is formed and the first interlayer insulating film 41 by means of a dry etching method, such as reactive ion etching, reactive ion beam etching, and the like. Moreover, the contact hole 81 may be formed by a wet etching method in addition to or instead of the dry etching method. As such, when the wet etching method is used, a portion located at the interface between the precursor film 421 and the curing layer 42*aa* in the sidewall of the contact hole 81 may be formed by the dry etching method, the portion may be covered with a protective film, such as, for example, resist and the like, and the contact hole 81 may be formed by the wet etching method. When the contact hole 81 is formed by only the wet etching method, the portion located at the interface between the precursor film 421 and the curing layer 42*aa* in the sidewall of the contact hole 81 may be covered with the protective film, such as resist and the like, and the portion may be protected such that it is not exposed to an etchant.

Then, wiring line materials that contain Al, such as Al, an Al alloy, and the like, are deposited nearly over an entire surface of the curing layer 42*aa* of the precursor film 421 by, for example, a sputtering method and the like, thereby forming a conductive film 6*aa*.

Then, in FIG. 10B, an etching process is performed with respect to the conductive film 6*aa* by using resists of predetermined patterns, and the conductive layer 6*aa* is patterned, thereby forming the data line 6*a*. At this time, when the patterning is completed and the data line 6*a* is formed, the surface of the precursor film 421 is partially exposed by a portion removed through the patterning of the conductive layer 6*aa*. The etching process is continuously performed with respect to the surface of the partially exposed precursor film 421, the surface of the precursor film 421 is overetched with a thickness of about d1=50 to 100 nm so as to remove the curing layer 42*aa*. Thereby, the lower interlayer insulating film 42 is formed, and the curing layer 42*aa* remains as the base of the data line 6*a*.

Then, in FIG. 11, the third interlayer insulating film 43, the pixel electrode 9*a*, and the alignment film 16 are formed. The third interlayer insulating film 43 is formed as a BPSG film by means of, for example, an atmospheric pressure or reduced-pressure CVD method. Alternatively, the third interlayer insulating film 43 is formed as a silicate glass film, such as PSG or BSG, a silicon nitride film or a silicon oxide film by means of, for example, an atmospheric pressure or reduced-pressure CVD method. Since the data line 6*a* containing Al exists below the third interlayer insulating film 43, the third interlayer insulating film 43 needs to be formed at a relatively low temperature of, for example, 400° C. or less. Further, the third interlayer insulating film 43 is preferably formed such that an etching rate with respect to the etchant used by the wet etching method in the second etching process to be described below is equal to or greater than that in the second interlayer insulating film 42.

After the contact hole 85 is formed, the ITO film is formed by the sputtering process, and the pixel electrode 9*a* is formed by the photolithographic method and the etching process.

Then, a coating liquid of an alignment film made of a material of polyimide is applied on the pixel electrode 9*a*, and an alignment process, such as a rubbing process, is performed in a predetermined direction so as to have a predetermined pretilt angle, thereby forming an alignment film 16. Thereby, a liquid crystal device 1 having a structure of the pixel portion shown in FIG. 5 is formed.

Method of Manufacturing TFT

Next, a process of manufacturing the TFT 30 will be described in detail with reference to FIG. 12.

Figure 12A:
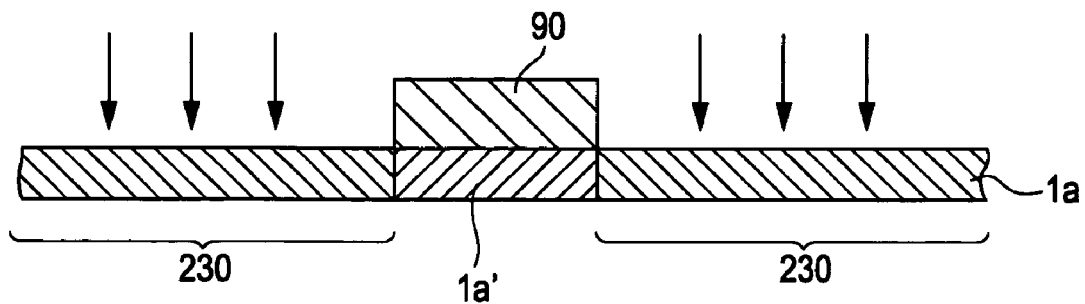
FIG. 12 is a cross-sectional view specifically illustrating a process of forming a TFT in a method of manufacturing an electro-optical device according to a first embodiment of the invention.

As shown in FIG. 12a, a resist film 90 is formed in a region that forms the channel region 1a' of the semiconductor layer 1a, then impurity ions are doped in the semiconductor layer 1a from the upper side of the resist film 90, and then an impurity region 230 is formed in the semiconductor layer 1a.

Figure 12B:
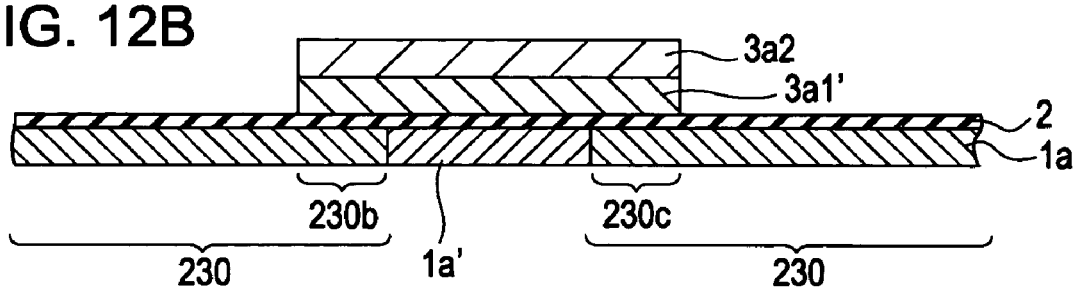

Then, as shown in FIG. 12B, the resist film 90 is removed, and the conductive film 3a1' forming the first gate electrode 3a1 and the second gate electrode 3a2 are sequentially formed so as to cover extending regions 230b and 230c of the impurity region 230 that extend along the edges of the channel region 1a', and the channel region 1a'. The conductive film 3a1' and the second gate electrode 3a2 are etched in a predetermined shape, and, for example, formed to have the same size. The conductive film 3a1' corresponds to, for example, a polysilicon film, and the second gate electrode 3a2 is formed of a metal silicide. Further, the extending regions 230b and 230c finally become the lightly doped source region 1b and the lightly doped drain region 1c.

Figure 12C:
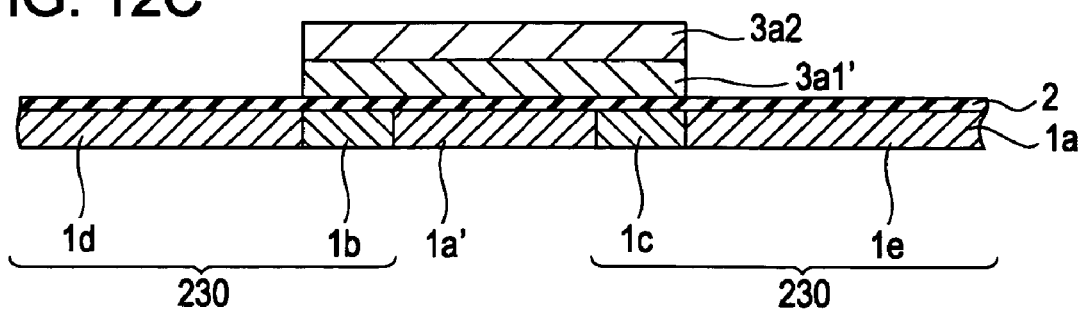

Then, as shown in FIG. 12C, impurity ions are doped in outside regions of the regions 230b and 230c of the impurity region 230 that are adjacent to the channel region 1a', that is, regions that finally become the heavily doped source region 1d and the heavily doped drain region 1e. At this time, the second gate electrode 3a2 functions as a mask such that impurity ions are not doped in the regions 230b and 230c, and the heavily doped source region 1d and the heavily doped drain region 1e, and the lightly doped source region 1b and the lightly doped drain region 1c are formed in the semiconductor layer 1a. In this case, since an implantation angle of impurity ions, that is, an ion implantation angle is about ±5°, the heavily doped source region 1d and the heavily doped drain region 1e are formed with a self alignment.

Figure 12D:
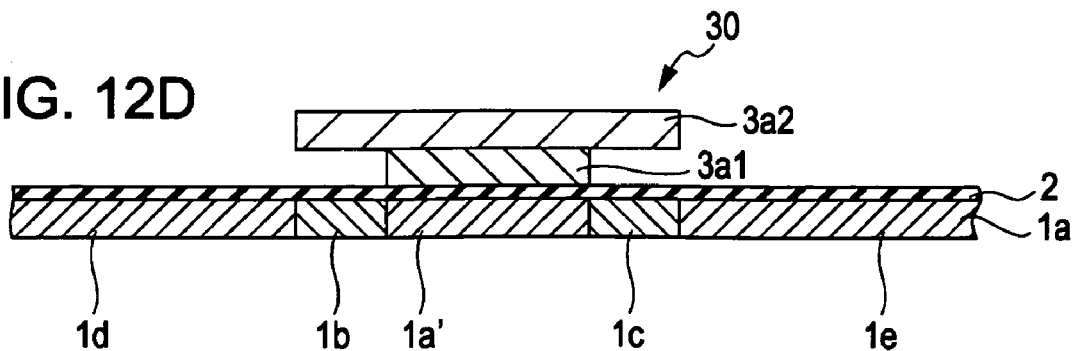

Then, as shown in FIG. 12D, the conductive film 3a1' is selectively removed from the side of the conductive film 3a1' by means of dry etching, such as, for example, an isotropic plasma treatment, and the first gate electrode 3a1 is formed such that it does not overlap the lightly doped source region 1b and the lightly doped drain region 1c. Thereby, the TFT 30 is formed. Accordingly, according to the method of manufacturing the electro-optical device according to this embodiment, with an LDD structure where the channel region 1a', the lightly doped source region 1b, the lightly doped drain region 1c, the heavily doped source region 1d, and the heavily doped drain region 1e are formed in the semiconductor layer 1a, and a light-shielding structure where the lightly doped source region 1b and the lightly doped drain region 1c are shielded from the light by the second gate electrode 3a2, the TFT 30 can be formed. In addition, since the first gate electrode 3a1 does not overlap the lightly doped source region 1b and the lightly doped drain region 1c, a parasitic capacitance generated between the first gate electrode 3a1, and the lightly doped source region 1b and the lightly doped drain region 1c can be reduced.

As such, according to the method of manufacturing the electro-optical device according to the present embodiment, it is possible to form the TFT 30 having the LDD structure capable of shielding the light from the lightly doped source region 1b and the lightly doped drain region 1c through which the light leakage current may easily flow. As a result, it is possible to manufacture an electro-optical device 1 in which images can be displayed with a high resolution by making use of the electrical characteristic by the LDD structure.

Second Embodiment

Next, a method of manufacturing an electro-optical device according to a third aspect of the invention will be described with reference to FIG. 13. In the description below, a process of manufacturing the TFT 30 will be mainly described. In addition, in the description below, the same constituent elements as those in the electro-optical device according to the first embodiment and the method of manufacturing the same are denoted by the same reference numerals, and the description thereof will be omitted.

Figure 13A:
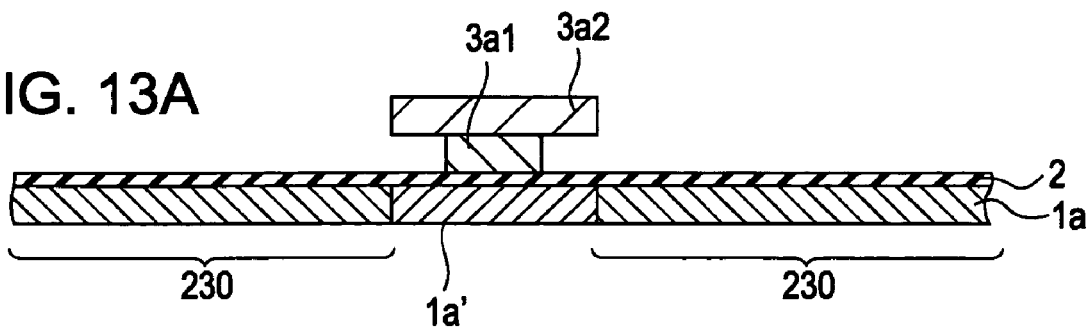
FIG. 13 is a cross-sectional view specifically illustrating a process of forming a TFT in a method of manufacturing an electro-optical device according to a second embodiment of the invention.

In FIG. 13A, in a state in which the channel region 1a' of the semiconductor layer 1a formed on the TFT array substrate 10 and the impurity region 230 are formed, the conductive film of the second gate electrode 3a2 and the conductive film serving as masks when the impurity region 230 is formed is selectively removed from the side of the conductive film, thereby forming the first gate electrode 3a1.

Figure 13B:
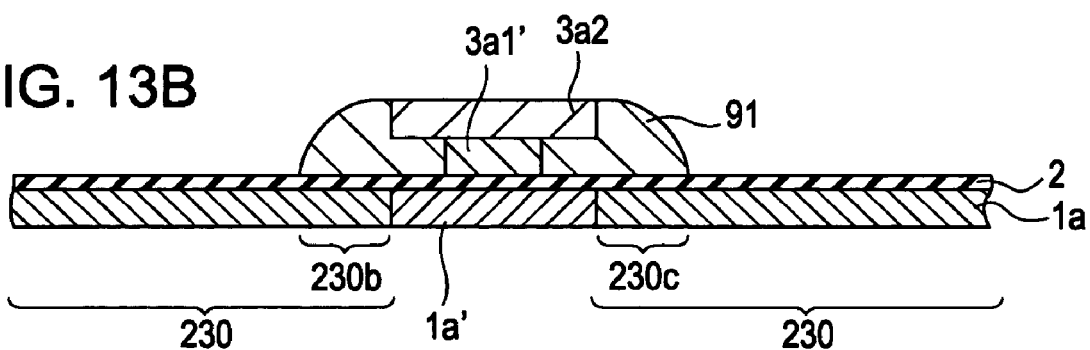

Then, as shown in FIG. 13B, the sidewall 91 is formed so as to cover the regions 230b and 230c of the impurity region 230 that are adjacent to the channel region 1a'. The sidewall 91 may be formed so as to have a size according to the width of each of the lightly doped source region 1b and the lightly doped drain region 1c to be formed.

Figure 13C:
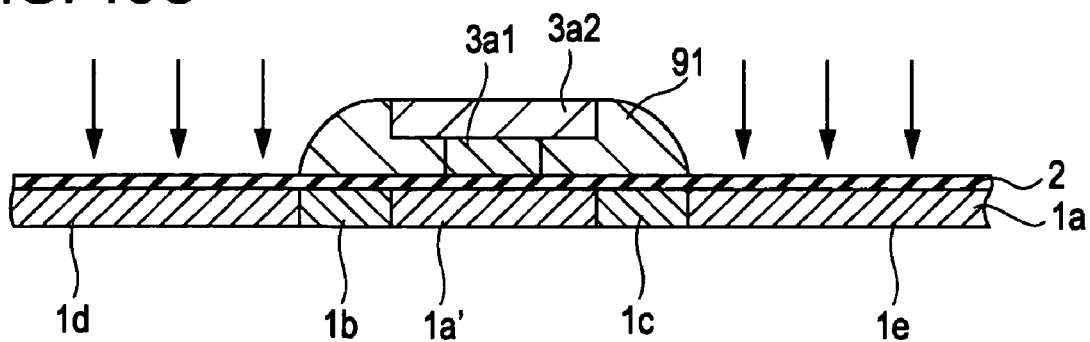

As shown in FIG. 13C, the impurity ions are doped in the outside regions of the regions 230b and 230c of the impurity region 230 from the upper sides of the second gate electrode 3a2 and the sidewall 91, and the heavily doped source region 1d and the heavily doped drain region 1e, and the lightly doped source region 1b and the lightly doped drain region 1c are formed in the semiconductor layer 1a.

Figure 13D:
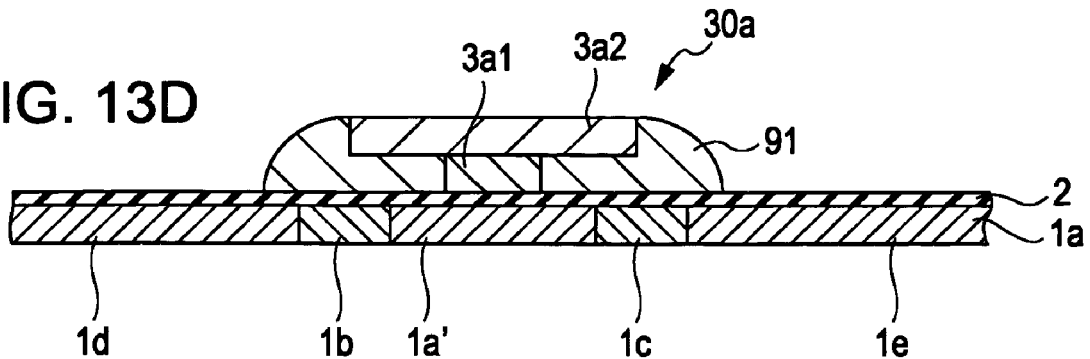

Then, as shown in FIG. 13D, the impurity ions are dispersed in the semiconductor layer 1a by heating the semiconductor layer 1a, thereby enlarging the heavily doped source region 1d and the heavily doped drain region 1e, and the lightly doped source region 1b and the lightly doped drain region 1c. As a result, the heavily doped source region 1d and the heavily doped drain region 1e, and the lightly doped source region 1b and the lightly doped drain region 1c, each of which has a size according to the design of the TFT 30, can be formed in the semiconductor layer 1a. The dispersion speed at which the impurity ions are dispersed in the semiconductor layer 1a is different according to the heat treatment condition. The heat treatment condition is set such that the impurity ions are not dispersed to the lower side of the first gate electrode 3a1, specifically, in a region serving as a substantial channel region, that is, such that the region of the semiconductor layer 1a below the first gate electrode 3a1 becomes a channel region.

According to a method of manufacturing the electro-optical device according to the present embodiment, the lightly doped source region 1b and the lightly doped drain region 1c can be shielded from the light by the sidewall 91 and the second gate electrode 3a1, thereby reducing the light leakage current. Accordingly, according to the method of manufacturing the electro-optical device according to the present embodiment, similar to the method of manufacturing the electro-optical device according to the first embodiment, it is possible to form the TFT 30a having an LDD structure by which the lightly doped source region 1b and the lightly doped drain region 1c where the light leakage current may easily flow can be shielded from the light. As a result, it is possible to manufacture an electro-optical device in which images can be displayed with a high resolution by making use of the electrical characteristic by the LDD structure.

Third Embodiment

Next, an embodiment of a method of manufacturing an electro-optical device according to a fourth aspect of the invention will be described with reference to FIGS. 14 to 16.

Figure 14A:
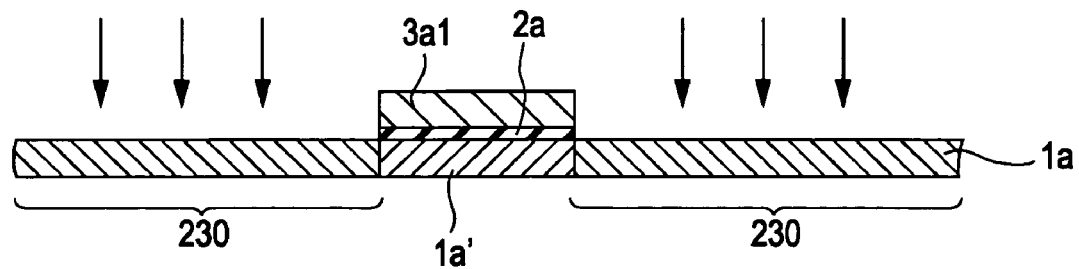
FIG. 14 is a cross-sectional view specifically illustrating a process of forming a TFT in a method of manufacturing an electro-optical device according to a third embodiment of the invention.

In FIG. 14A, by using the conductive material, such as polysilicon and the like, the first gate electrode 3a1 are formed with the insulating film 2a interposed between the first gate electrode 3a1 and the channel region 1a' so as to cover the channel region 1a' in the semiconductor layer 1a formed on the TFT array substrate 10, and impurity ions are doped in the semiconductor layer 1a while using the first gate electrode 3a1 as a mask. Thereby, the impurity region 230 is formed around the channel region 1a'.

Figure 14B:
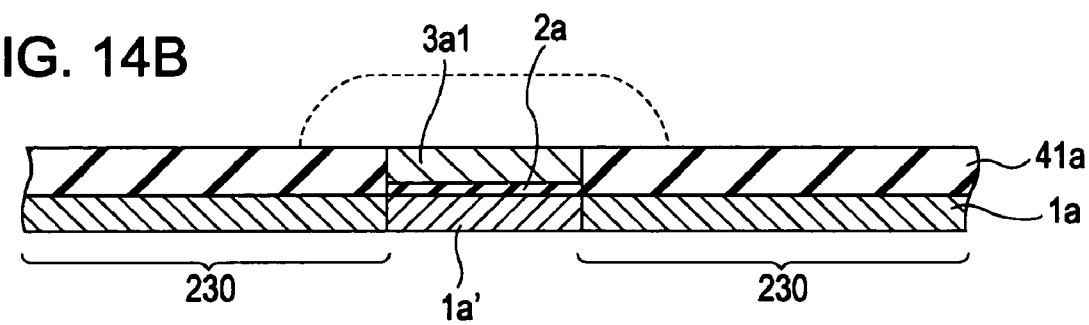

Next, as shown in FIG. 14B, the insulating film 41a made of an insulating material, such as $SiO_2$, is formed so as to cover the impurity region 230 and the first gate electrode 3a1, then the insulating film 41a is polished until the first gate electrode 3a1 is exposed, and the polishing surface of the insulating film 41a and the exposed surface of the first gate electrode 3a1 exposed to the polishing surface are flush with each other. At this time, the polishing surface of the insulating film 41a and the exposed surface of the first gate electrode 3a1 exposed to the polishing surface are flush with each other by means of, for example, a CMP method.

Figure 14C:
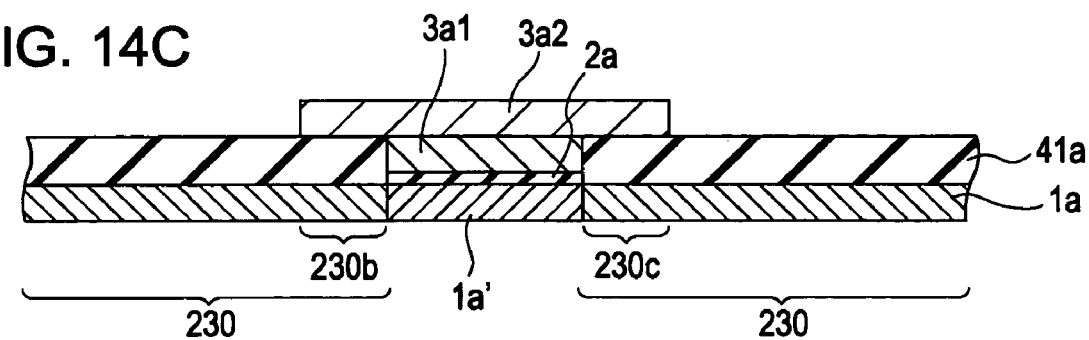

Then, as shown in FIG. 14C, in order to cover the regions 230b and 230c of the impurity region 230 that are adjacent to the channel region 1a', the second gate electrode 3a2 is formed on the first gate electrode 3a1 using, for example, metal silicide. In this case, since the polishing surface of the insulating film 41a and the exposed surface of the first gate electrode 3a1 exposed to the polishing surface are flush with each other, it is possible to form the second gate electrode 3a2 that is made of metal silicide so as to have excellent quality and minimal defects.

Figure 14D:
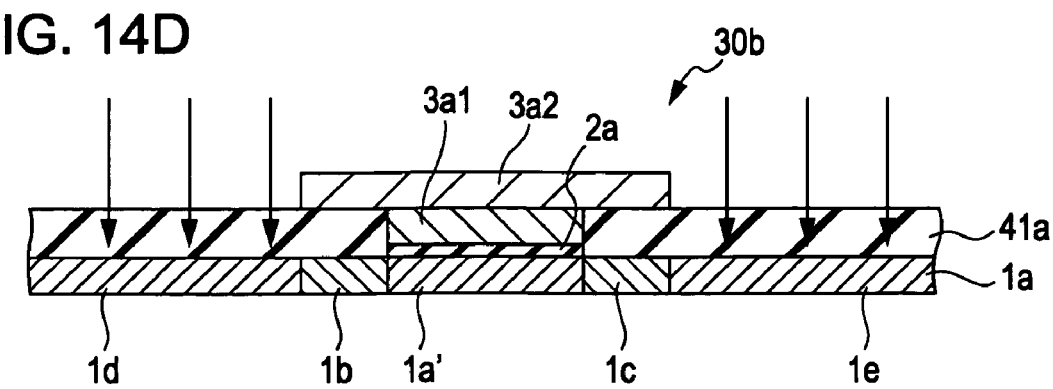

Then, as shown in FIG. 14D, the impurity ions are doped in the outside regions of the regions 230b and 230c of the impurity region 230 from the upper side of the second gate electrode 3a2, and the heavily doped source region 1d and the heavily doped drain region 1e, and the lightly doped source region 1b and the lightly doped drain region 1c are formed in the semiconductor layer 1a. At this time, an ion implantation angle is set to about ±5° C., so that the heavily doped source region 1d and the heavily doped drain region 1e can be formed with a self alignment.

As such, according to a method of manufacturing an electro-optical device according to the present embodiment, similar to the methods of manufacturing the electro-optical devices according to the first and second embodiments, the light leakage current can be reduced, and the electro-optical device having the TFT with the LDD structure can be formed with a high performance by a simple manufacturing process.

First Modification

Then, a method of manufacturing an electro-optical device according to a first modification will be described with reference to FIG. 15.

Figure 15A:
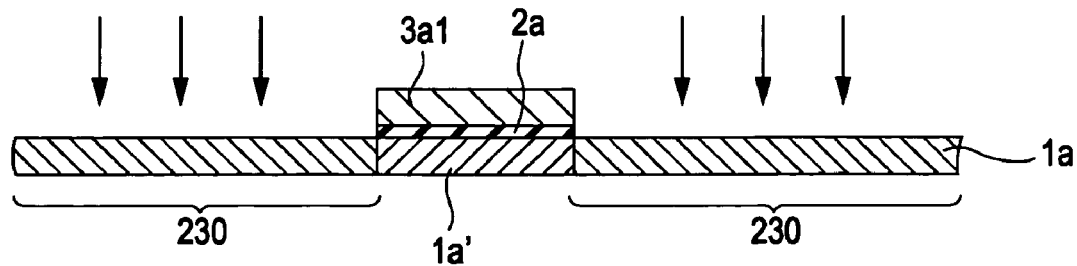
FIG. 15 is a cross-sectional view specifically illustrating a process in a method of manufacturing an electro-optical device according to a modification of a third embodiment of the invention.

In FIG. 15A, the first gate electrode 3a1 is formed of a conductive material, such as polysilicon and the like. At this time, the first gate electrode 3a1 is formed on the channel region 1a' with an insulating film 2a interposed therebetween, such that it covers the channel region 1a' of the semiconductor layer 1a that is formed on the TFT array substrate 10, and the impurity ions are doped in the semiconductor layer 1a while using the first gate electrode 3a1 as a mask. Thereby, the impurity region 230 is formed around the channel region 1a'.

Figure 15B:
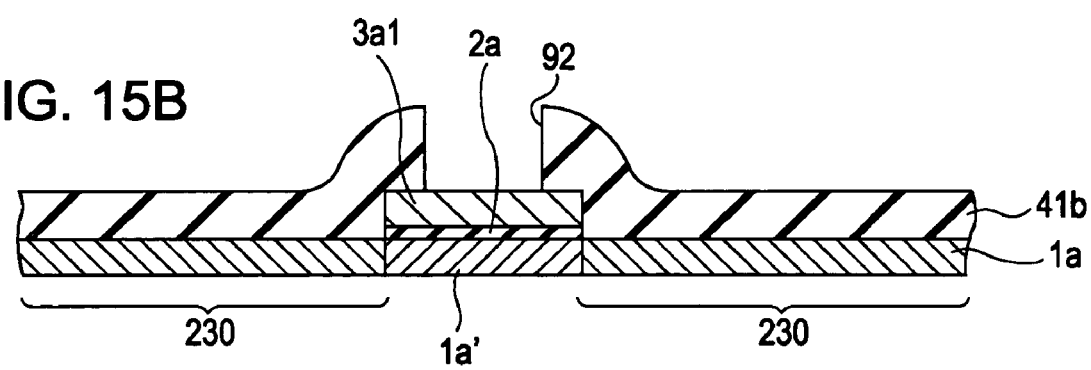

Then, in FIG. 15B, the insulating film 14b is formed so as to cover the impurity region 230 and the first gate electrode 3a1, and the portion of the insulating film 41b that extends on the channel region 1a' is removed by etching. Thereby, the opening 92 is formed in the insulating film 41b, and the surface of the first gate electrode 3a1 is exposed to the opening 92.

Figure 15C:
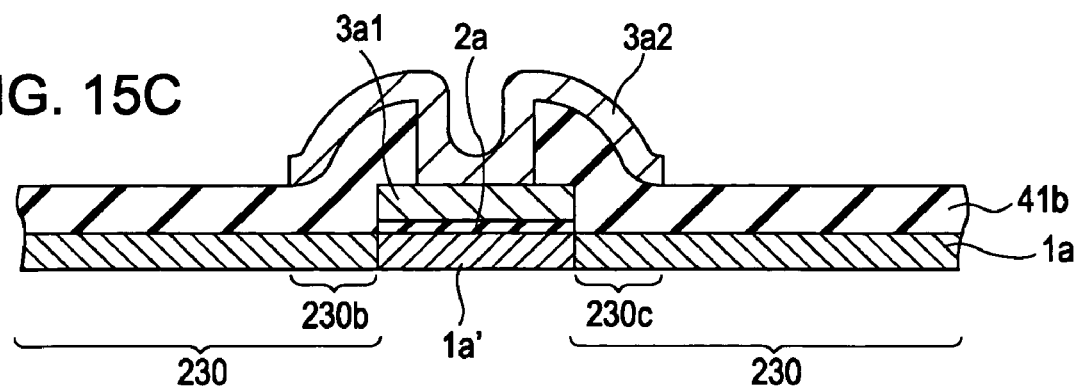
Figure 15D:
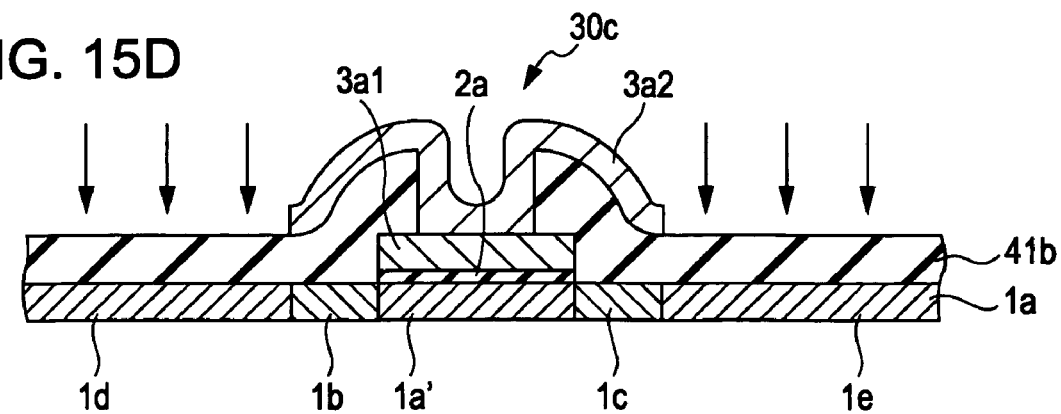

Then, in FIG. 15C, the second gate electrode 3a2 is formed on the first gate electrode 3a1 that is exposed to the opening 92, and the first gate electrode 3a1 and the second gate electrode 3a2 are electrically connected to each other. Thereby, the insulating film covering the first gate electrode does not need to be removed by using a polishing method, such as, for example, a CMP method. For example, when the first gate electrode has a very small thickness of nanometer order, it is possible to effectively suppress the first gate electrode 3a1 from being damaged due to the polishing.

Moreover, the second gate electrode 3a2 is etched in a predetermined shape such that the second gate electrode 3a2 overlaps the regions finally forming the lightly doped source region and the lightly doped drain region, or such that the second gate electrode 3a2 does not overlap the regions finally forming the lightly doped source region and the lightly doped drain region.

Similar to the cases described in FIGS. 6 and 7, in the TFT 30c included in the electro-optical device, the second gate electrode 3a2 and the scanning line 3a may be electrically connected to each other in a region for avoiding a region on the channel region 1a'. In this case, when the contact hole is formed in the insulating film, it is possible to suppress the first gate electrode 3a1 from being damaged. Further, the first gate electrode 3a1 and the scanning line 3a can be electrically connected to each other while excellently maintaining the quality of the first gate electrode.

Second Modification

Next, a method of manufacturing an electro-optical device according to a second modification will be described with reference to FIG. 16. The method of manufacturing the electro-optical device according to the second modification is different from the method of manufacturing the electro-optical device according to the first modification in that the edges of the opening 92 are partially removed.

Figure 16A:
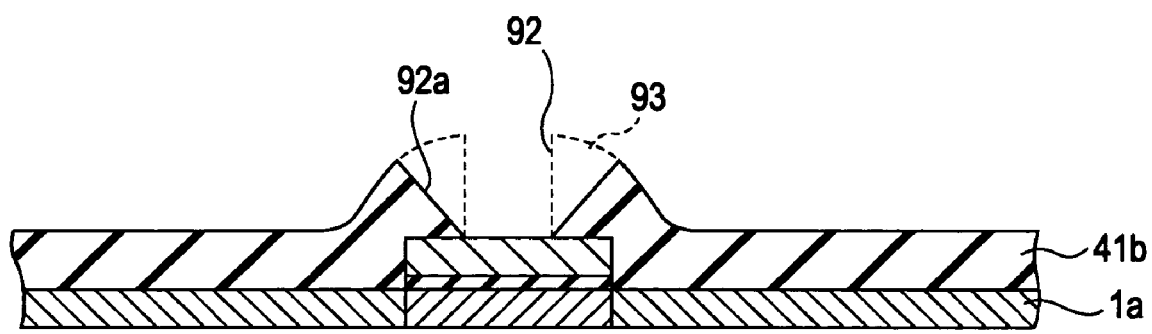
FIG. 16 is a cross-sectional view specifically illustrating a process in a method of manufacturing an electro-optical device according to a modification of a third embodiment of the invention.

In FIG. 16A, a protrusion 93 of the insulating film 41b that protrudes on the edge of the first gate electrode 3a1 is removed by means of a dry etching method or a wet etching method, and the opening 92a defined by the sidewall having a curved surface is formed.

Figure 16B:
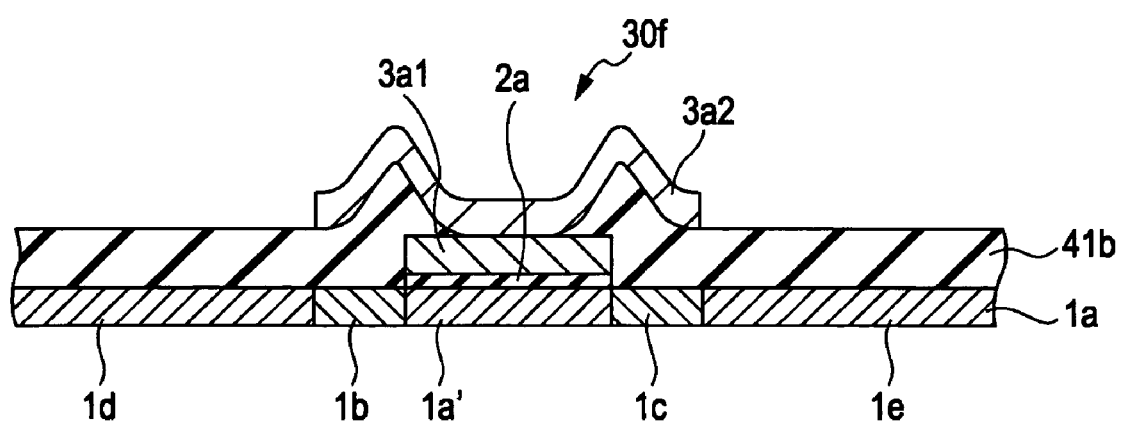

Then, in FIG. 16B, the second gate electrode 3a2 is formed along the smooth surface of the protrusion 93, then the impurity ions are doped while using the second gate electrode 3a2 as a mask, and then the TFT 30f is formed. The method of manufacturing the electro-optical device according to the second modification is better than the method of manufacturing the electro-optical device according to the above-mentioned embodiment in that it is possible to improve coverage of the insulating film 41b and the second gate electrode 3a2 formed on the insulating film.

Electronic Apparatus

Next, examples in which the above-mentioned liquid crystal device is applied to various electronic apparatuses will be described.

Figure 17:
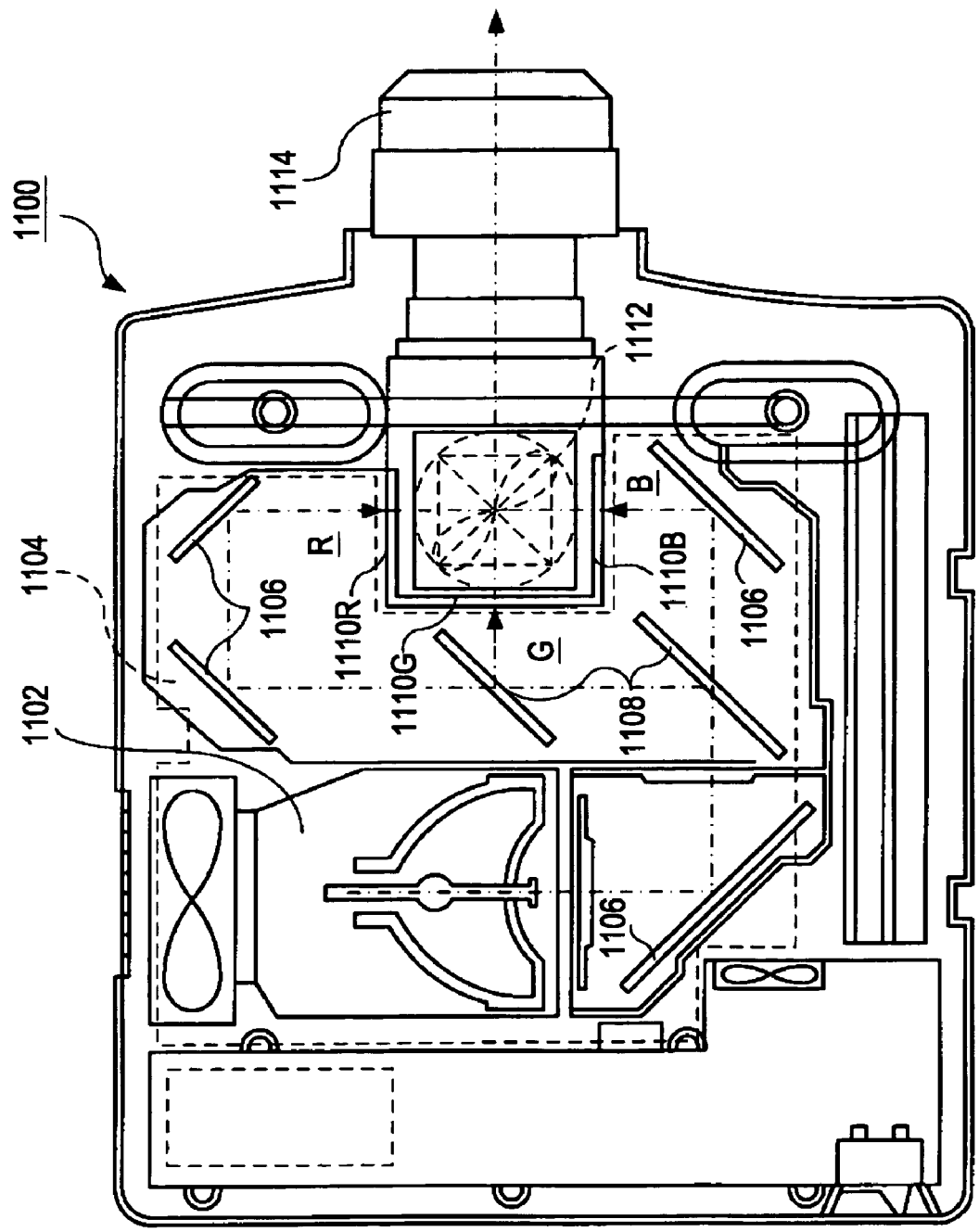
FIG. 17 is a plan view illustrating a structure of a projector that is an example of an electronic apparatus to which a liquid crystal device is applied.

First, a projector in which the liquid crystal device is used as a light valve will be described. FIG. 17 is a plan view illustrating an example of a structure of a projector. As shown in FIG. 17, in a projector 1100, a lamp unit 1102 that is composed of a white light source, such as a halogen lamp, is provided. Light emitted from the lamp unit 1102 is separated into light of three primary colors for R, G, and B by means of four mirrors 1106 and two dichroic mirrors 1108 that are disposed in a light guide 1104, and then incident on liquid crystal panels 1110R, 1110B, and 1110G serving as light valves that correspond to the respective three primary colors.

Each of the liquid crystal panels 1110R, 1110B, and 1110G has the same structure as the above-mentioned liquid crystal device. The liquid crystal panels 1110R, 1110B, and 1110G are respectively driven by three primary color signals for R, G, and B supplied from external circuits (not shown) to external connecting terminals 102. In addition, the light that is modulated by these liquid crystal panels is incident on a dichroic prism 1112 in three directions. In the dichroic prism 1112, the light of R and B is refracted at 90 degrees, and the light of G propagates straight. Accordingly, images of the respective colors are synthesized. As a result, color images are projected onto a screen and the like through a projection lens 1114.

In this case, focusing on display images by the liquid crystal panels 1110R, 1110B, and 1110G, the display image by the liquid crystal panel 1110G needs to be inverted in a horizontal direction with respect to the display images by the liquid crystal panels 1110R and 1110B.

Further, on the liquid crystal panels 1110R, 1110B, and 1110G, the light corresponding to the respective primary colors including R, G, and B is incident by means of the dichroic mirror 1108. Therefore, a color filter does not need to be provided.

Figure 18:
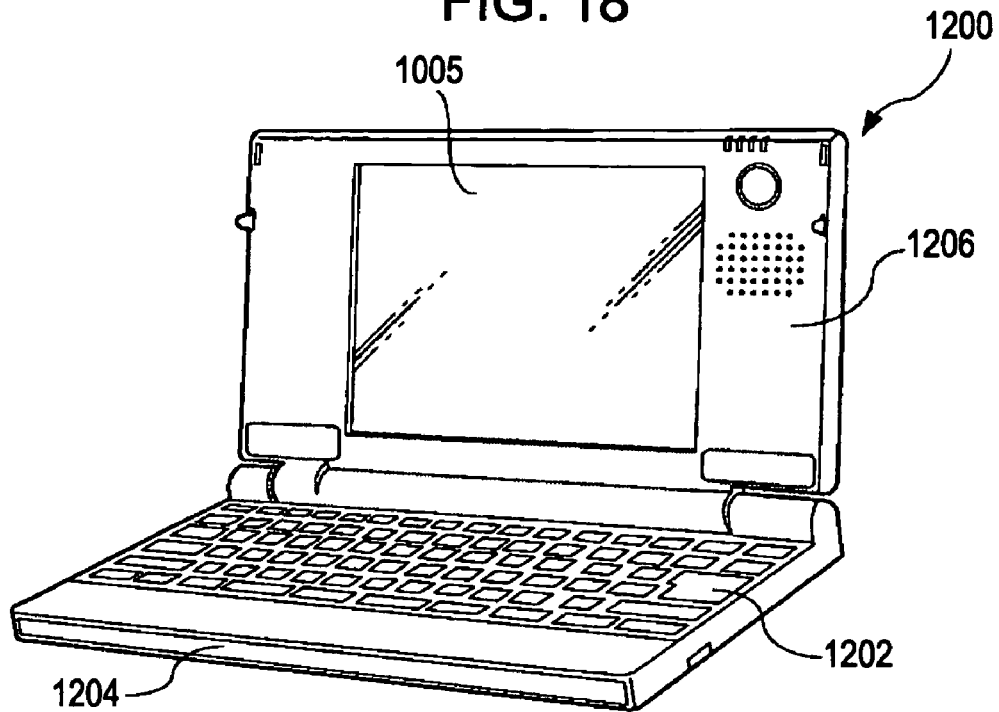
FIG. 18 is a perspective view illustrating a structure of a personal computer that is an example of an electronic apparatus to which a liquid crystal device is applied.

Next, an example in which the above-mentioned liquid crystal device is applied to a mobile personal computer will be described. FIG. 18 is a perspective view illustrating a structure of a personal computer. In FIG. 18, a computer 1200 includes a main body portion 1204 having a keyboard 1202, and a liquid crystal display unit 1206. The liquid crystal display unit 1206 is constructed by additionally providing a backlight on a back surface of the above-mentioned liquid crystal device 1005.

Figure 19:
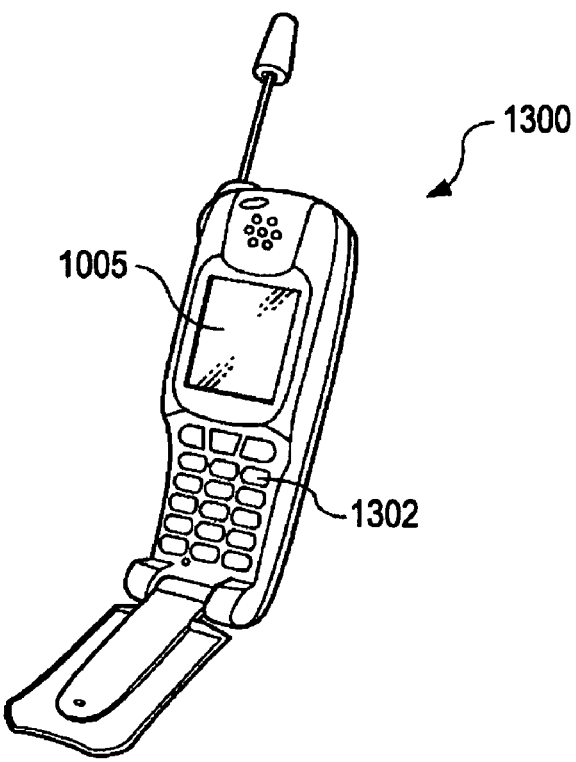
FIG. 19 is a perspective view illustrating a structure of a cellular phone that is an example of an electronic apparatus to which a liquid crystal device is applied.

Further, an example in which the above-mentioned liquid crystal device is applied to a cellular phone will be described. FIG. 19 is a perspective view illustrating a structure of the cellular phone. In FIG. 19, a cellular phone 1300 includes a plurality of operation buttons 1302, and a reflective liquid crystal device 1005. A front light is provided on a front surface of the reflective liquid crystal device 1005, if necessary.

Examples of the electronic apparatus may include a liquid crystal television, a view-finder-type or monitor-direct-view-type video tape recorder, a car navigation device, a pager, an electronic note, an electronic calculator, a word processor, a workstation, a video phone, a POS terminal, an apparatus having a touch panel, and the like, in addition to the electronic apparatuses described with reference to FIGS. 17 to 19. Further, it is needless to say that the above-mentioned liquid crystal device may be applied to the various electronic apparatuses.

The invention is not limited to the above-mentioned embodiments. That is, various changes and modifications can be made without departing from the spirit and scope of the invention that is readable from the appended claims and the entire specification. An electro-optical device where the modifications and the changes are made, a method of manufacturing the electro-optical device, and an electronic apparatus including the electro-optical device are also within a technical range of the invention.

The entire disclosure of Japanese Patent Application No. 2005-337003, filed Nov. 22, 2005 is expressly incorporated by reference herein.

What is claimed is:

1. A method of manufacturing an electro-optical device, comprising, above a substrate:
    forming a plurality of data lines and a plurality of scanning lines that intersect each other;
    forming resist films in predetermined regions of semiconductor layers that are formed above the substrate;
    doping impurities into the semiconductor layers using the resist films as masks so as to form impurity regions around the predetermined regions;
    after removing the resist films, forming conductive films to be first gate electrodes and second gate electrodes of transistors so as to cover the predetermined regions and regions of the impurity regions adjacent to the predetermined regions in a longitudinal direction of channels of the transistors, wherein the second gate electrodes are disposed on the first gate electrodes;
    doping the impurities into outside regions of the regions of the impurity regions adjacent to the predetermined regions while using the second gate electrodes as masks so as to form heavily doped regions and lightly doped regions whose impurity concentrations are different from each other in the semiconductor layers;
    after doping the impurities into outside regions of the regions of the impurity regions adjacent to the predetermined regions while using the second gate electrodes as masks, selectively removing portions of the conductive films from sides of the conductive films under the second gate electrodes so that the first gate electrodes do not overlap the lightly doped regions and the second gate electrodes at least partially overlap the lightly doped regions; and
    forming pixel electrodes so as to correspond to the intersections between the plurality of data lines and the plurality of scanning lines.

2. A method of manufacturing an electro-optical device comprising, above a substrate:
    forming a plurality of data lines and a plurality of scanning lines that intersect each other;
    forming first gate electrodes so as to cover predetermined regions of semiconductor layers that are formed above the substrate;
    doping impurities into the semiconductor layers using the first gate electrodes as masks so as to form impurity regions around the predetermined regions;
    forming insulating films so as to cover the impurity regions and the first gate electrodes;
    polishing the insulating films until the first gate electrodes are exposed, wherein polished surfaces of the polished insulating films and exposed surfaces of the first gate electrodes are flush with each other;
    after polishing the insulating films, forming second gate electrodes on the first gate electrodes and on at least a portion of the polished surfaces of the insulating films so as to cover the predetermined regions and at least a portion of regions of the impurity regions adjacent to the predetermined regions in a longitudinal direction of channels of the transistors formed in the predetermined regions;
    doping the impurities into outside regions of at least the portion of regions of the impurity regions adjacent to the predetermined regions in the longitudinal direction of the channels of the transistors while using the second gate electrodes as masks so as to form heavily doped regions and lightly doped regions whose impurity concentrations are different from each other in the semiconductor layers, wherein the first gate electrodes do not overlap the lightly doped regions and the second gate electrodes at least partially overlap the lightly doped regions; and forming a plurality of pixel electrodes so as to correspond to the intersections between the plurality of data lines and the plurality of scanning lines.

3. The method of manufacturing an electro-optical device according to claim 2, further comprising, prior to the forming of the second gate electrodes:

forming insulating films so as to cover the impurity regions and the first gate electrodes, polishing the insulating films until the first gate electrodes are exposed, and causing polished surfaces of the polished insulating films and exposed surfaces of the first gate electrodes exposed to the polished surfaces to be flush with each other.

4. The method of manufacturing an electro-optical device according to claim 2, wherein, during the forming of the second gate electrodes, the second gate electrodes are electrically connected to portions of the first gate electrodes that extend to the outside regions of the predetermined regions in a direction crossing a longitudinal direction of the channels of the transistors in plan view.

5. The method of manufacturing an electro-optical device according to claim 2, further comprising, prior to the forming of the second electrodes:

forming insulating films so as to cover the impurity regions and the first gate electrodes, and forming openings to which at least portions of surfaces of the first gate electrodes are exposed by removing portions of the insulating films.

6. The method of manufacturing an electro-optical device according to claim 5, wherein during the forming of the openings, protrusions of the insulating films that protrude on the first gate electrodes are partially removed.

7. A method of manufacturing an electro-optical device, comprising:

forming a data line and scanning line that intersect each other;

forming a semiconductor layer above a substrate, the semiconductor layer including a predetermined region;

forming a conductive film as a first gate electrode above the predetermined region of the semiconductor layer;

forming a second gate electrode on the conductive film;

doping impurities into the semiconductor layer using the second gate electrode as a mask to form impurity regions around the predetermined region;

after doping the impurities into the semiconductor layer using the second gate electrode as the mask, selectively removing side portions of the conductive film under the second gate electrode to form the first gate electrode, the second gate electrode being disposed on the first gate electrode;

forming sidewalls to cover at least a portion of regions of the impurity regions adjacent to the predetermined regions in a longitudinal direction of a channel formed in the predetermined region;

doping impurities into outside regions that are a portion of the impurity regions using the second gate electrode and the sidewalls as masks to form heavily doped regions and lightly doped regions in the semiconductor layer, the heavily doped regions and the lightly doped regions having impurity concentrations different from each other;

heating the semiconductor layer to enlarge the heavily doped regions and the lightly doped regions so that the first gate electrode does not overlap the lightly doped regions and the second gate electrode at least partially overlaps the lightly doped regions; and forming a pixel electrode corresponding to the intersection between the data line and the scanning line.

* * * * *